(12) United States Patent
Pagani

(10) Patent No.: US 10,280,070 B2
(45) Date of Patent: May 7, 2019

(54) MAGNETIC INERTIAL SENSOR ENERGY HARVESTING AND SCAVENGING METHODS, CIRCUITS AND SYSTEMS

(71) Applicant: STMICROELECTRONICS S.r.l., Agrate, Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 610 days.

(21) Appl. No.: 14/871,322

(22) Filed: Sep. 30, 2015

(65) Prior Publication Data

US 2017/0093265 A1    Mar. 30, 2017

(51) Int. Cl.
*H02K 3/00* (2006.01)
*B81B 3/00* (2006.01)
*G01C 19/5776* (2012.01)

(52) U.S. Cl.
CPC ........ *B81B 3/0021* (2013.01); *G01C 19/5776* (2013.01)

(58) Field of Classification Search
CPC ........ H02K 35/02; B81B 3/00; B81B 3/0021; G01C 19/5776; G01P 15/18
See application file for complete search history.

(56) References Cited

U.S. PATENT DOCUMENTS

| | | | |
|---|---|---|---|
| 6,131,457 A | 10/2000 | Sato | |
| 6,262,463 B1 | 7/2001 | Miu et al. | |
| 6,404,192 B1 | 6/2002 | Chiesi et al. | |
| 7,501,302 B2 | 3/2009 | Kvisteroy | |
| 7,886,595 B2 | 2/2011 | Fischer et al. | |

(Continued)

FOREIGN PATENT DOCUMENTS

WO        03/065075 A2    8/2003

OTHER PUBLICATIONS

Beeby et al., "Energy harvesting vibration sources for microsystems applications," Institute of Physics Publishing, Meas. Sci. Technol. 17 (2006), R175-R195, published Oct. 26, 2006, 21 pages.

(Continued)

*Primary Examiner* — Naishadh N Desai
(74) *Attorney, Agent, or Firm* — Seed IP Law Group LLP

(57) ABSTRACT

A magnetic energy harvesting and scavenging circuit includes a first substrate having a first surface and a second surface. An energy harvesting and scavenging coil is formed proximate the first surface. An electromechanical systems device, which may be a MEMS device, includes a moveable mass that extends over the first surface of the first substrate and may be displaced relative to the substrate in three dimensions responsive to an external force applied to the moveable mass. The movable mass includes at least one permanent magnet that is magnetically coupled to the energy harvesting and scavenging coil. Energy harvesting and scavenging circuitry, which may be formed in the first substrate where the first substrate is a semiconductor chip, is electrically coupled to the energy harvesting and scavenging coil and generates electrical energy due to magnetic flux variation through the energy harvesting and scavenging coil responsive to movement of the moveable mass.

14 Claims, 29 Drawing Sheets

(56) References Cited

U.S. PATENT DOCUMENTS

| 2010/0187835 A1* | 7/2010 | Hohlfeld | B81B 3/0021 |
| | | | 290/1 R |
| 2011/0140458 A1 | 6/2011 | Arnold et al. | |
| 2011/0210722 A1 | 9/2011 | Paci et al. | |
| 2013/0255381 A1 | 10/2013 | Ricotti et al. | |

OTHER PUBLICATIONS

Lueke et al., "MEMS-Based Power Generation Techniques for Implantable Biosensing Applications," Department of Mechanical Engineering, University of Alberta, Canada, Sensors 2011, 11, 1433-1460, published Jan. 26, 2011, 28 pages.

Mitcheson et al., "Performance limits of the three MEMS inertial energy generator transduction types," Journal of Micromechanics and Microengineering, 17 (2007) S211-S216, published Aug. 31, 2007, 6 pages.

Pérez-Rodriquez et al., "Electromagnetic Inertial Generator for Vibrational Energy Scavenging Compatible With Si Technology," The Fifth International Workshop on Micro and Nanotechnology for Power Generation and Energy Conversion Applications, PowerMEMS 2005, Nov. 28-30, 2005, Takeda Hall, The University of Tokyo, Tokyo, Japan, 4 pages.

Wang et al., "A Microelectroplated Magnetic Vibration Energy Scavenger for Wireless Sensor Microsystems," IEEE International Conference on Nano/Micro Engineered and Molecular Systems, Jan. 20-23, 2010, Xiamen, China, 4 pages.

* cited by examiner

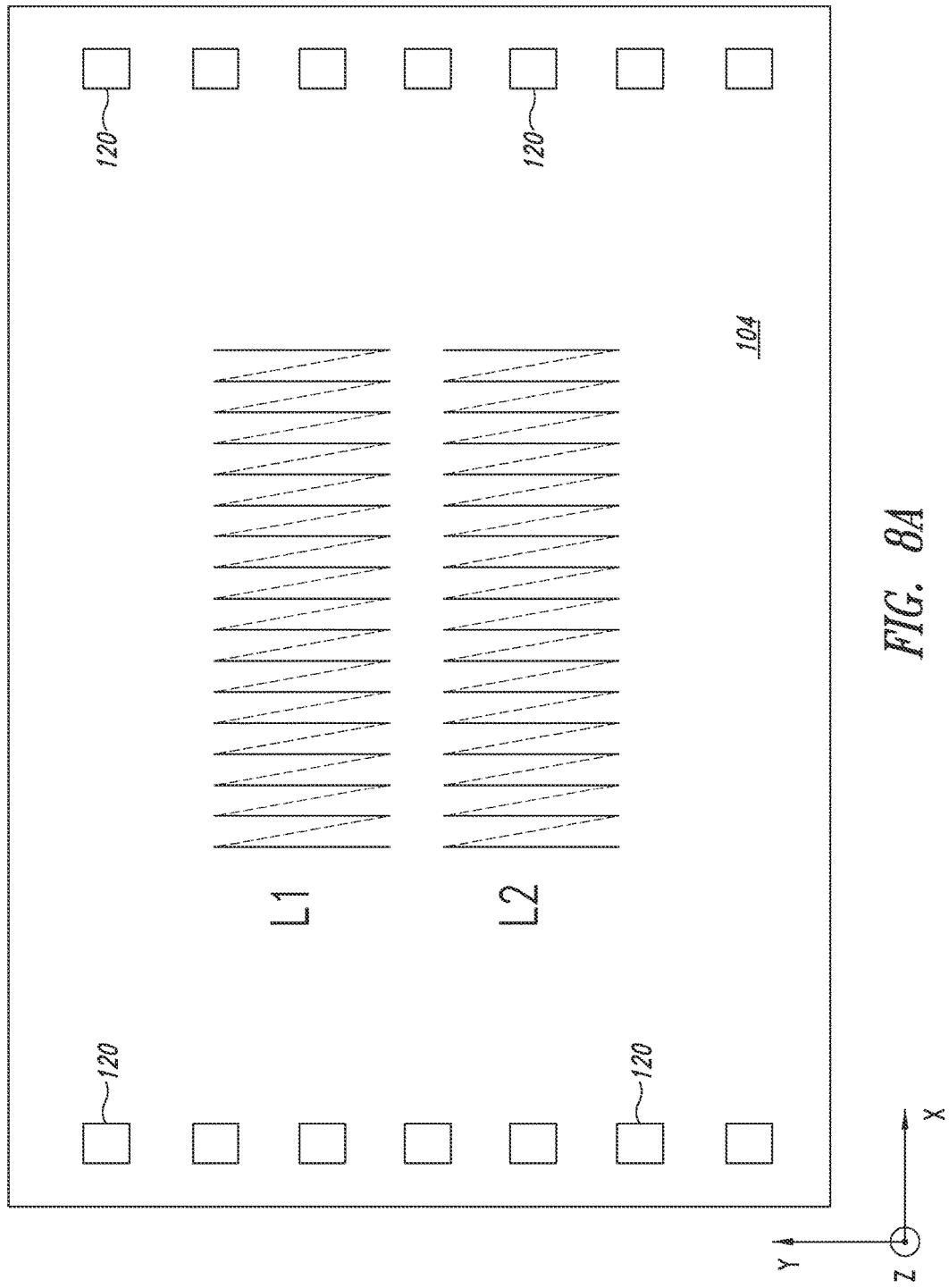

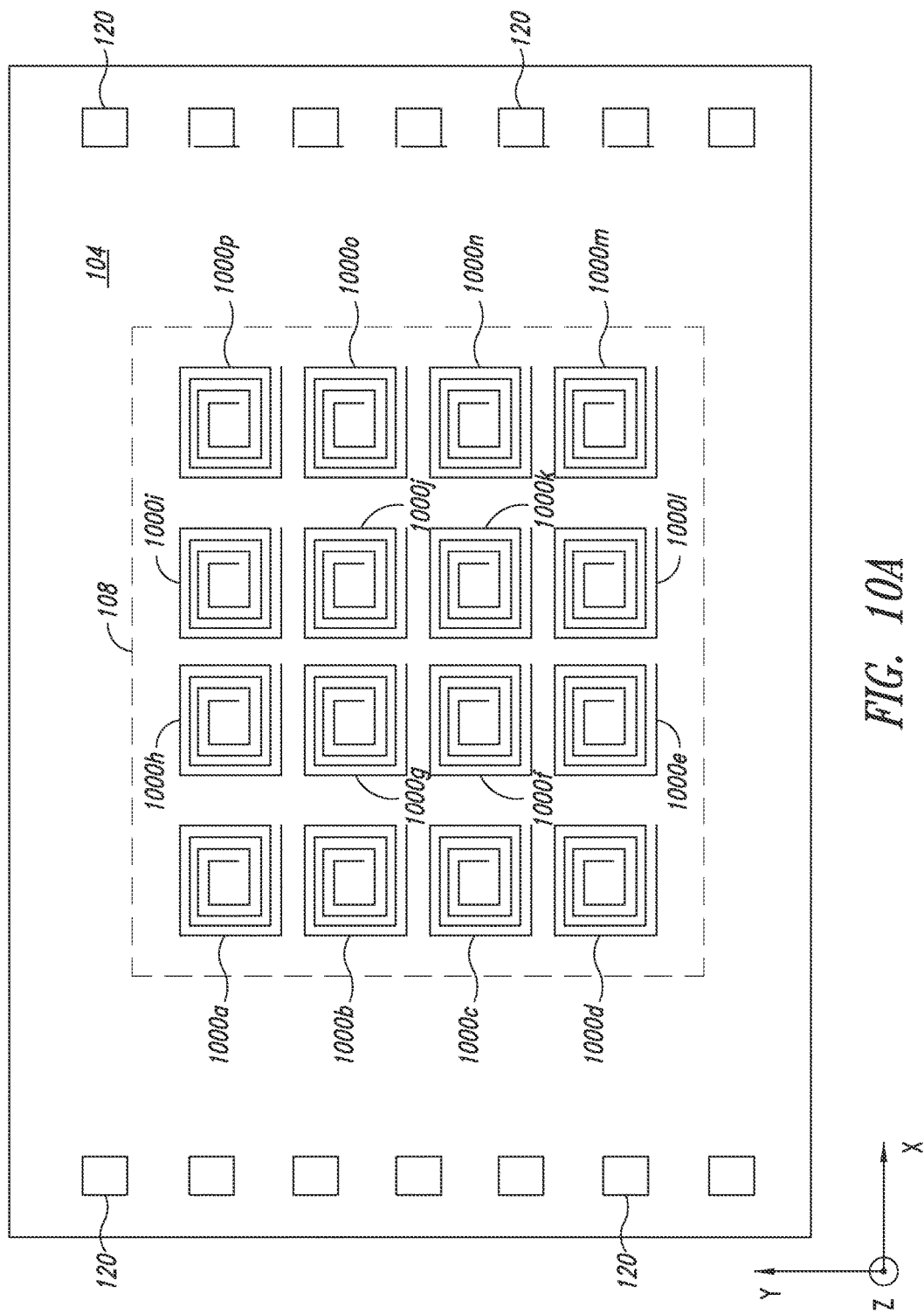

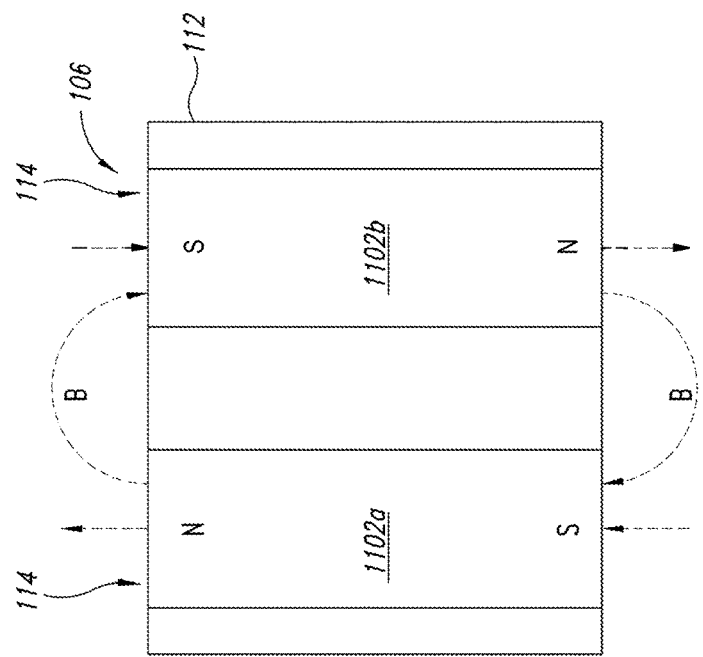
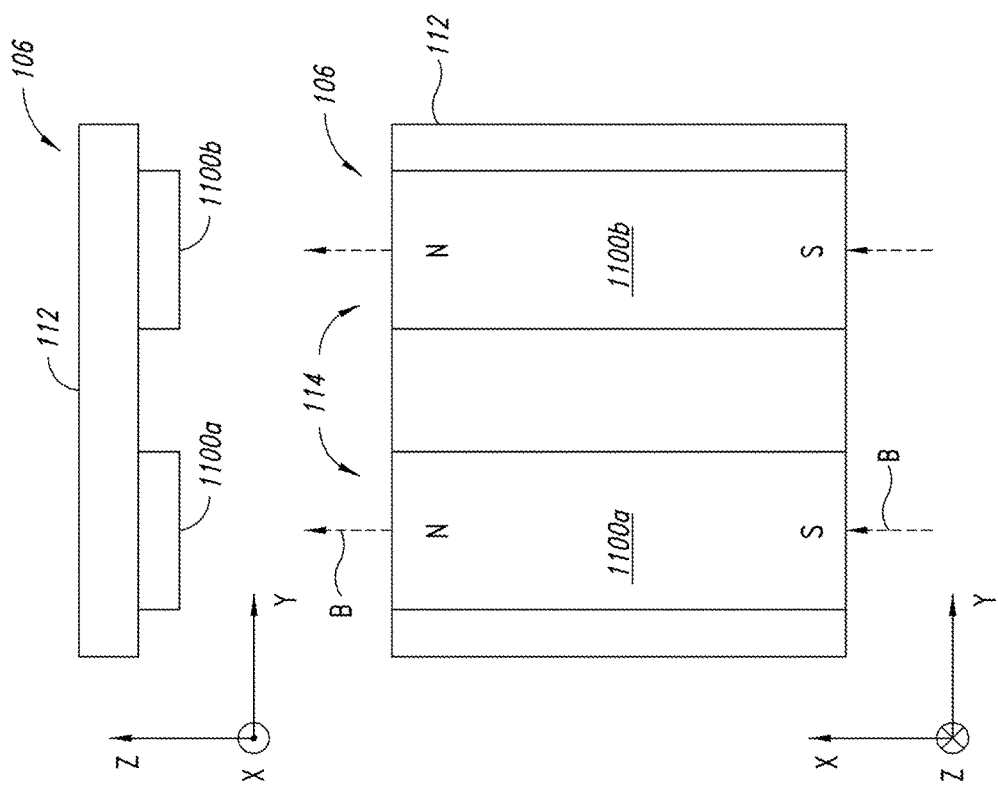
FIG. 11A
FIG. 11B

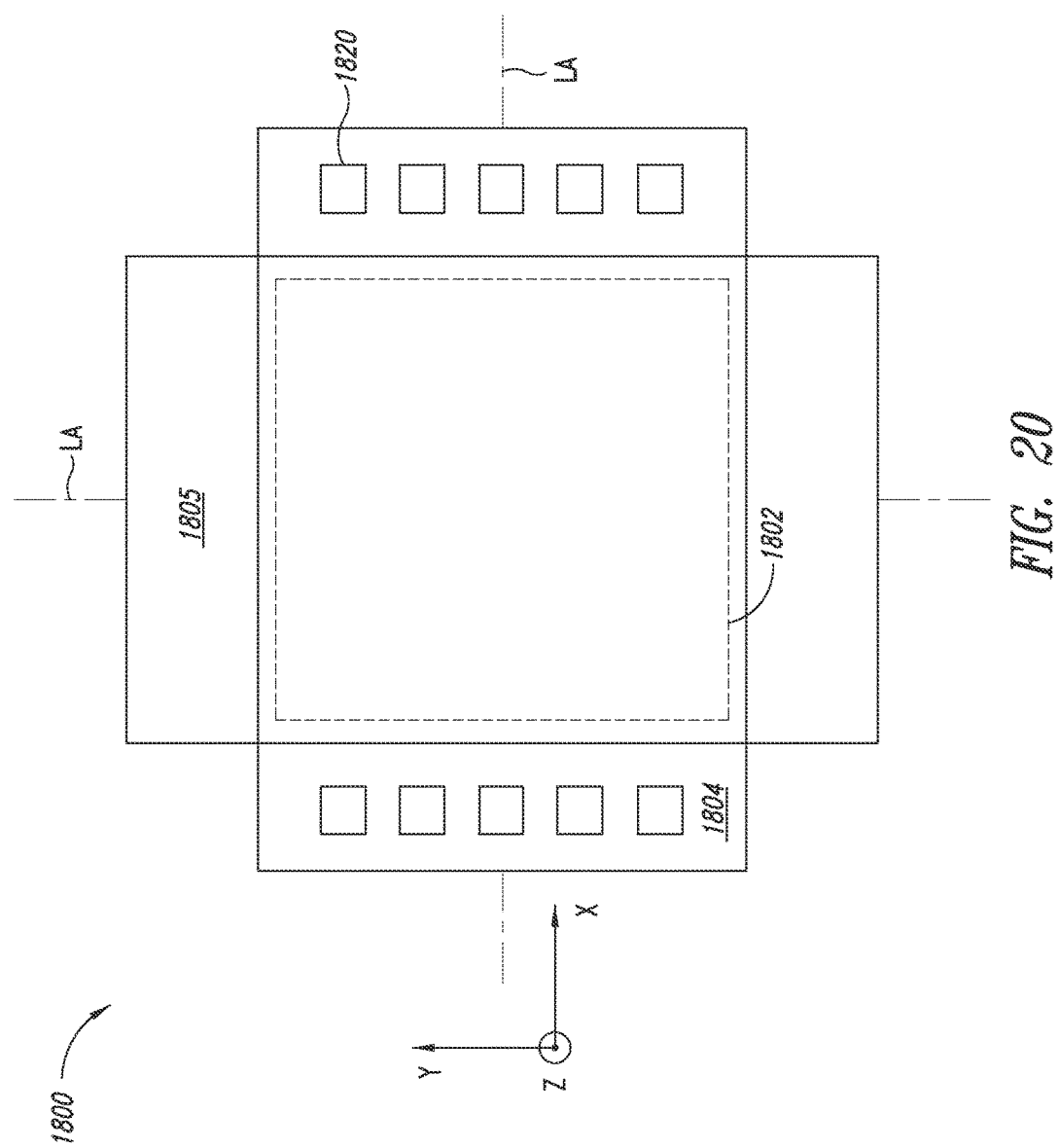

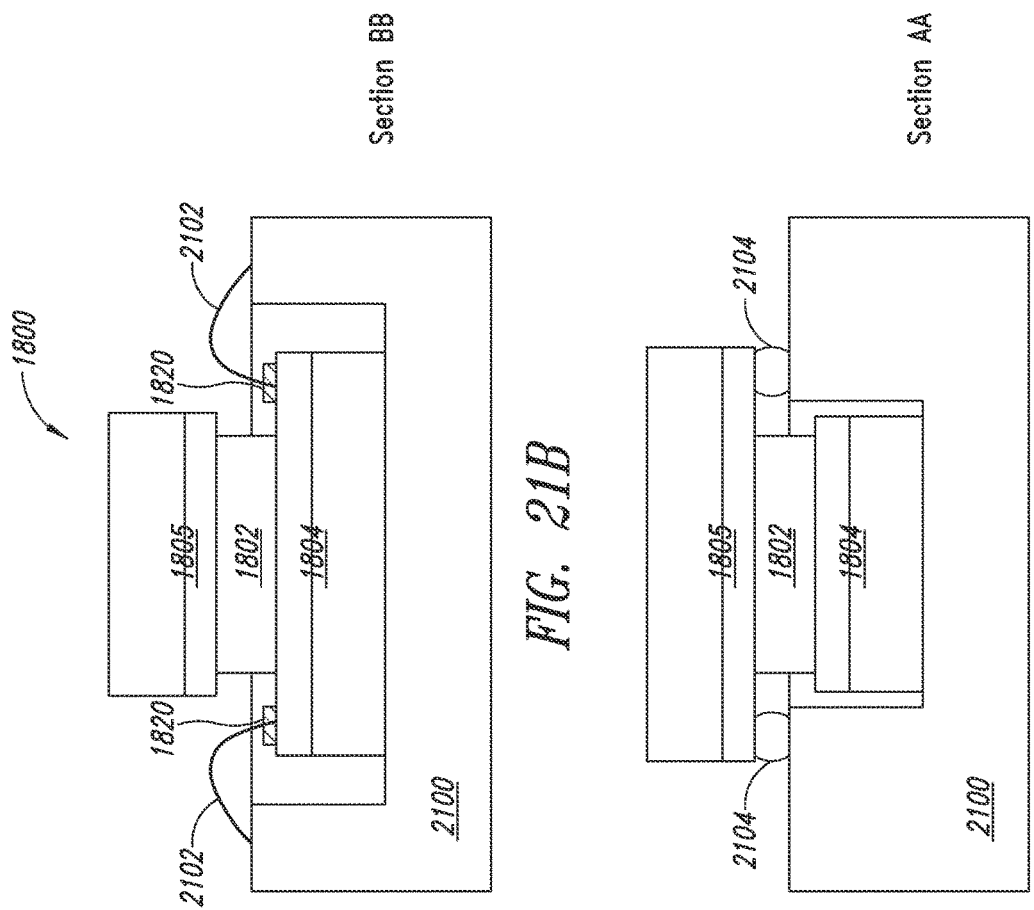

MAGNETIC INERTIAL SENSOR ENERGY HARVESTING AND SCAVENGING METHODS, CIRCUITS AND SYSTEMS

BACKGROUND

Technical Field

The present disclosure relates to generally to energy harvesting and scavenging, and more specifically to the utilization of a magnetic inertial sensor structure for energy harvesting and scavenging.

Description of the Related Art

Energy harvesting and energy scavenging are processes by which electrical energy is derived from an external power source, such as solar power, thermal energy, wind energy, or kinetic energy. This electrical energy is captured and stored for use to power an electronic device. The energy source for energy harvesting and scavenging is present as an ambient or background source of energy and is inherently present and thus free, in contrast to large scale electrical power generation where an input fuel like natural gas, oil, coal, or water is used in power generation. The two terms energy harvesting and energy scavenging are many times used interchangeably but are typically distinguished by the nature of the energy source. Energy harvesting is most accurately applied to situations where the external energy source is well known and regularly present, whereas energy scavenging applies where the external energy source is not well known and may be irregular or intermittently present.

Energy harvesting and scavenging are thus utilized to provide a very small amount of electrical energy that may be utilized to power low-power electronic devices. The electronic device is typically a small, wireless device like those contained in wearable electronics such as a smart watch, an activity or fitness tracker, and so on. In such a wearable electronic device, a user wears the device and the mechanical or kinetic energy in the form of movement of the user may be harvested or scavenged to generate electrical energy. There is a need for improved energy harvesting and scavenging techniques that increase the generated electrical energy.

BRIEF SUMMARY

One embodiment of the present disclosure is a magnetic energy harvesting and scavenging circuit that includes a first substrate having a first surface and a second surface. At least one energy harvesting and scavenging coil is formed proximate the first surface. An electromechanical systems device includes a moveable mass that extends over the first surface of the first substrate and may be displaced relative to the first substrate in three dimensions responsive to an external force applied to the moveable mass. The movable mass includes at least one permanent magnet that is magnetically coupled to each energy harvesting and scavenging coil. Energy harvesting and scavenging circuitry is electrically coupled to the energy harvesting and scavenging coil and generates electrical energy due to magnetic flux variation through the energy harvesting and scavenging coil responsive to movement of the moveable mass. The electromechanical systems device may be a microelectromechanical systems (MEMS) device.

BRIEF DESCRIPTION OF THE SEVERAL VIEWS OF THE DRAWINGS

For a better understanding of the present disclosure, embodiments thereof are now described purely by way of non-limiting example, with reference to the attached drawings, wherein:

FIG. 8A is a top view of a first semiconductor chip including the two EHS coils of the embodiments of FIGS. 7A and 7B.

FIG. 10A is a top view of a first semiconductor chip that once again includes a number of horizontally-arranged EHS coils according to a still further embodiment of the present disclosure.

FIG. 11A is a bottom and cross-sectional view of another embodiment of a moveable mass that may be utilized in any of the prior embodiments of FIGS. 1-10.

FIG. 11B is a bottom view of yet another embodiment of a moveable mass that may be utilized in any of the prior embodiments of FIGS. 1-10.

FIG. 20 illustrates one embodiment of the magnetic EHS device of FIG. 18 or 19 in which the first and second semiconductor chips are rotated ninety degrees relative to one another.

FIG. 21B is a cross-sectional view of the magnetic EHS device and package substrate along the BB-axis of FIG. 21A.

FIG. 21C is a cross-sectional view of the magnetic EHS device and package substrate along the AA-axis of FIG. 21A.

DETAILED DESCRIPTION

Figure 1:
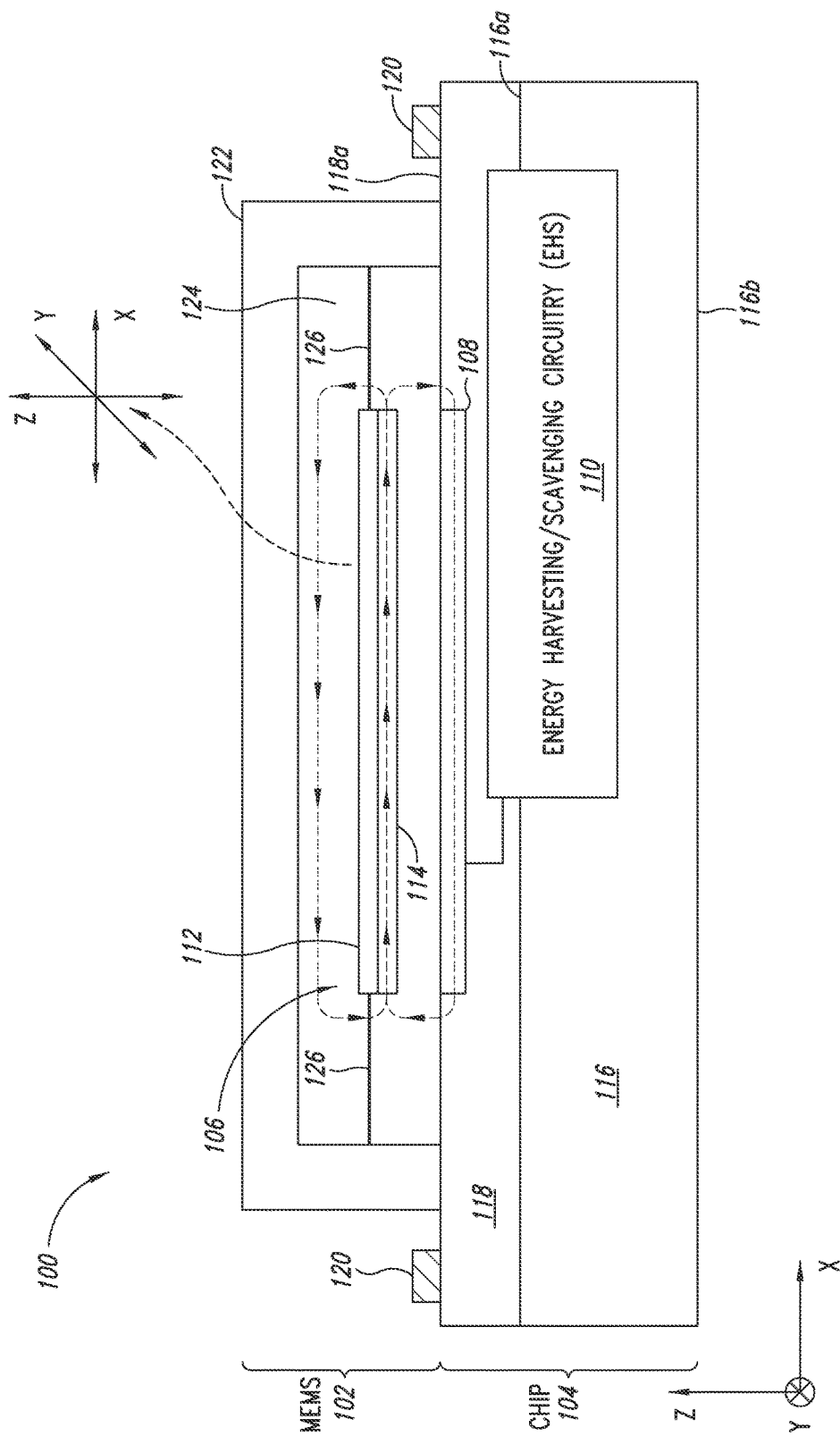
FIG. 1 is a simplified cross-sectional and functional diagram of a magnetic energy harvesting and scavenging (EHS) device including a microelectromechanical systems (MEMS) device and a first semiconductor chip according to one embodiment of the present disclosure.

FIG. 1 is a simplified cross-sectional and functional diagram of a magnetic energy harvesting and scavenging (EHS) device 100 including a microelectromechanical systems (MEMS) device 102 and a first semiconductor integrated circuit or chip 104 according to one embodiment of the present disclosure. The MEMS device 102 includes a suspended or moveable mass 106 positioned above an energy harvesting and scavenging (EHS) antenna, inductor or coil 108 which is, in turn, coupled to EHS circuitry 110 formed in the first semiconductor chip 104. The moveable mass 106 includes a magnet support layer 112 to which a permanent magnet layer 114 is attached. In operation, external forces experienced by the magnetic EHS device 100 produce stresses that cause movement of the moveable mass 106 relative to the EHS coil 108. The permanent magnet layer 114 generates a magnetic field B and movement of the moveable mass 106 and thereby the permanent magnet layer causes a change or variation over time in the magnetic coupling of this magnetic field to the EHS coil 108. This variation in magnetic coupling is the variation over time of the magnetic flux of the magnetic field B through the EHS coil 108. This change in magnetic flux results in energy being stored in the EHS coil 108 and this energy is then captured by the EHS circuitry 110. The structure and operation of the magnetic EHS device 100 will be described in more detail below.

Through selection of a suitable material for the permanent magnet layer 114, the magnetic field B generated by this layer may generate a magnetic field B having a sufficiently large intensity or magnitude to result in the EHS circuitry 110 capturing enough electrical energy to power electronic circuitry (not shown in FIG. 1) formed in the first semiconductor chip 104 or circuitry coupled to this chip. In one embodiment, the permanent magnet layer 114 is formed from a ferromagnetic material with a high residual magnetic field Br and high coercive field strength Hc so that external magnetic fields will not modify the polarization of the material. Suitable magnetic materials for the permanent magnet layer 114 include "hard" magnetic materials such as alloys of iron, cobalt, and nickel. More specifically, for example suitable materials for the permanent magnet layer 114 include Alnico, Samarium Cobalt (SmCo) alloys, and Neodymium Iron Boron (NdFeB) alloys. Any permanent magnetic material that generates a suitably large magnetic field B may be utilized, with the material ideally also having a high residual magnetic field Br and a high coercive field strength Hc.

In the present description, certain details are set forth in conjunction with the described embodiments to provide a sufficient understanding of the present disclosure. One skilled in the art will appreciate, however, that embodiments of the disclosure may be practiced without these particular details. Furthermore, one skilled in the art will appreciate that the present disclosure is not limited to the example embodiments described below, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. The operation of well-known components and/or processes has not been shown or described in detail below to avoid unnecessarily obscuring the present disclosure. Finally, components that are common among the described embodiments are given the same reference numbers or descriptors in the present application even the specific operation of such components may vary among embodiments.

Still referring to FIG. 1, the first semiconductor chip 104 includes a substrate 116 made of semiconductor material such as silicon, for example. The substrate 116 has a first face 116a and an opposite second face 116b. Formed on the first face 116a of the substrate 116 is a structural layer 118, which may also be made of dielectric on the first face 116a of the substrate. Present inside the structural layer 118 are, according to one embodiment, one or more levels of conductive traces connected to one another by conductive vias and sealed at the top with a passivation layer. This passivation layer and conductive traces are not shown in FIG. 1, except for connection or bonding pads 120 which are part of the one or more levels of conductive traces.

The EHS circuitry 110 is formed in the substrate 116 or, alternatively, in the structural layer 118, or in both the substrate and structural layer. The EHS circuitry 110 could also be formed in neither the substrate 116 nor the structural layer 118, but instead may be formed external to the chip 104 and be electrically coupled to the chip 104. The EHS coil 108 is formed in the structural layer 118 in one embodiment. In the embodiment of FIG. 1, the EHS coil is formed from multiple conductive layers of the structural layer 118, as will be described in more detail below with reference to FIGS. 2 and 5. The EHS coil 108 is formed from a suitable conductive material, such as metal, and is formed on a top surface 118*a* of the structural layer 118 in the illustrated embodiment. Alternatively, the EHS coil can extend within the structural layer 118 at a distance from the top surface 118*a*, or on the top surface 118*a* of the structural layer, or in yet another embodiment may be formed on top of the passivation layer previously mentioned and which is formed on the structural layer but not shown in FIG. 1.

The MEMS device 102 and the first semiconductor chip 104 may be galvanically isolated because there are not electrical or electronic structures in the MEMS device 102 that need to be electrically connected with the first semiconductor chip 104, and this increases the system reliability and lifetime, reducing also system complexity and cost. Furthermore, although the embodiment of FIG. 1 includes the MEMS device 102 positioned on the semiconductor chip 104, the MEMS device 102 may be mounted to or attached to other devices as well. Instead of the chip 104, for example, the MEMS device 102 could be positioned on a substrate, on which for example EHS coil 108 may be created, such as the substrate 116 made of a semiconductor material or a substrate made of another material, for example ceramic, glass or a PCB (Printed Circuit Board) material that may be rigid or flexible. In such an embodiment, the EHS circuitry 110 could be formed in the substrate or external to the substrate. In addition, although the embodiment of FIG. 1 includes the MEMS device 102, other electromechanical systems (EMS) devices could be utilized in the EHS device 100 in place of the MEMS device 102 in other embodiments of the present disclosure. Such an EMS device could be a discrete system formed from discrete components or parts also created using different materials and assembled together, as opposed to the MEMS device 102 formed in a semiconductor substrate using semiconductor device fabrication technologies, as will be appreciated by those skilled in the art.

Figure 2:
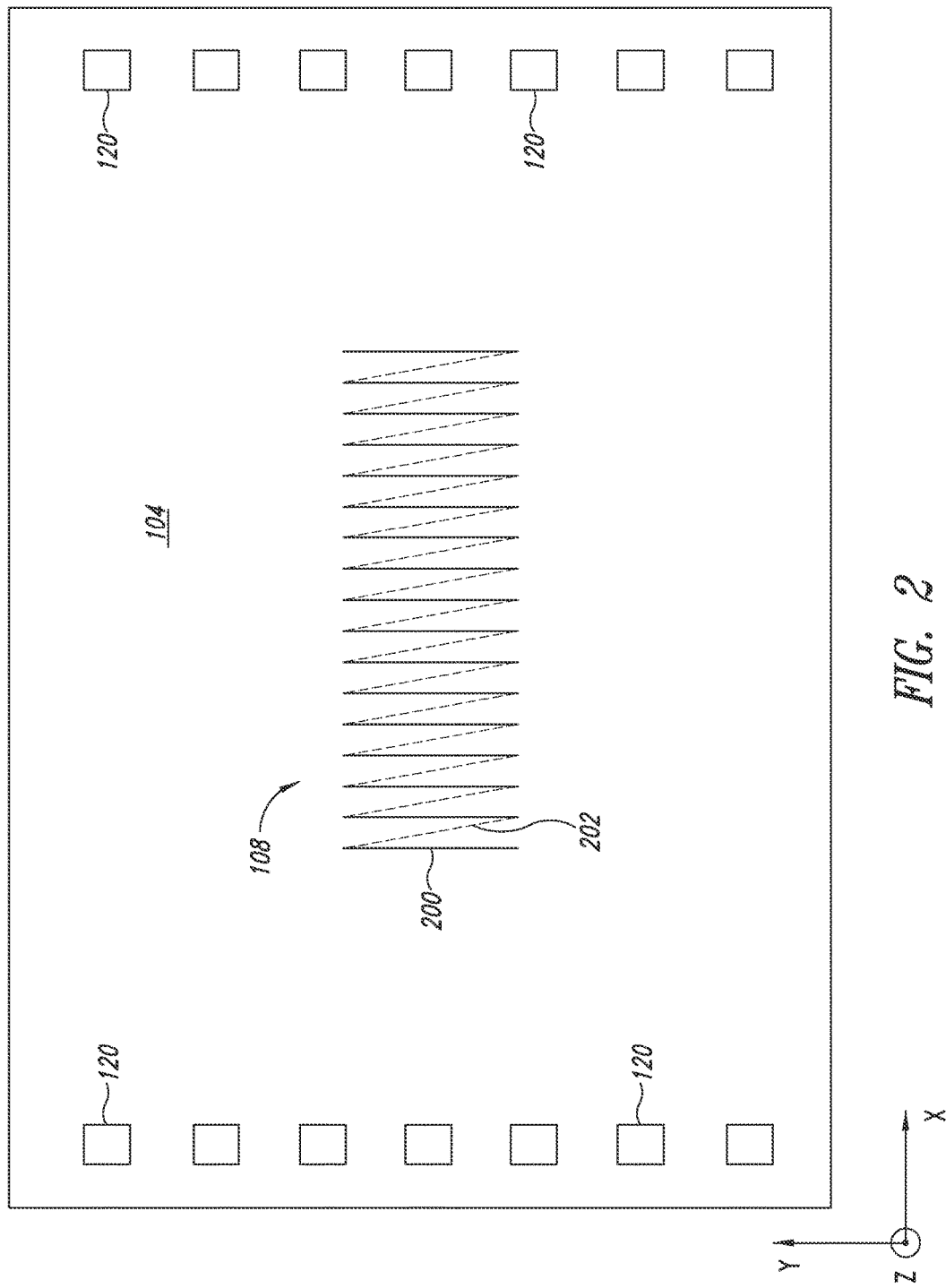
FIG. 2 is a top view of the first semiconductor chip of FIG. 1 illustrating an energy harvesting and scavenging (EHS) coil according to one embodiment of the present disclosure.

FIG. 2 is a top view of the first semiconductor chip 104 of FIG. 1 illustrating in more detail one embodiment of the EHS coil 108. In the embodiment of FIG. 2, the EHS coil 108 is formed from two different levels of conductive material formed in the structural layer 118 (FIG. 1) that are interconnected by vias (not shown FIG. 2). Conductive traces 200 are formed from a first upper level of conductive material in the structural layer 118 while conductive traces 202 are formed from a second lower-level conductive material. The conductive traces 202 are shown through dashed lines in FIG. 2 since these traces are formed in the lower-level of conductive material.

Referring back to FIG. 1, the magnetic MEMS device 102 includes a packaging structure 122 that is set directly on the top surface 118*a* of the structural layer in the embodiment of FIG. 1. Alternatively, the magnetic MEMS device 102 can be set facing the top surface 118*a* of the structural layer 118 but separated from the structural layer by means of one or more coupling layers, for example a layer of adhesive material. In this way, the packaging structure 122 of the MEMS device 102 is fixed with respect to the first semiconductor chip 104. The packaging structure 122 defines an internal cavity 124 of the MEMS device 102 where the internal cavity houses the moveable mass 106 that is suspended within the internal cavity by means of a supporting structure 126.

The supporting structure 126 suspends the moveable mass 106 within the internal cavity 124 such that the moveable mass is mobile or capable of moving in three dimensions. This three-dimensional movement of the moveable mass 106 is represented through X, Y and Z axes shown in upper right hand portion of FIG. 1. In other embodiments the moveable mass 106 is moveable in fewer than three dimensions, but three-dimensional movement of the moveable mass is preferable since this should result in a larger capture of electrical energy responsive to movement of the moveable mass, as will be appreciated by those skilled in the art. The packaging structure 122 and the supporting structure 126 are made of semiconductor material such as silicon in the embodiment of FIG. 1, but in general the packaging structure and the supporting structure as well as the magnetic support layer 112 of the moveable mass 106 may be made of materials other than a semiconductor material. A suitable material would be selected, at least in part, on the basis of desired characteristics of flexibility and strength of the material for use in formation of the packaging structure 122, the supporting structure 126 and possibly the magnetic support layer 112 as well.

Figure 3:
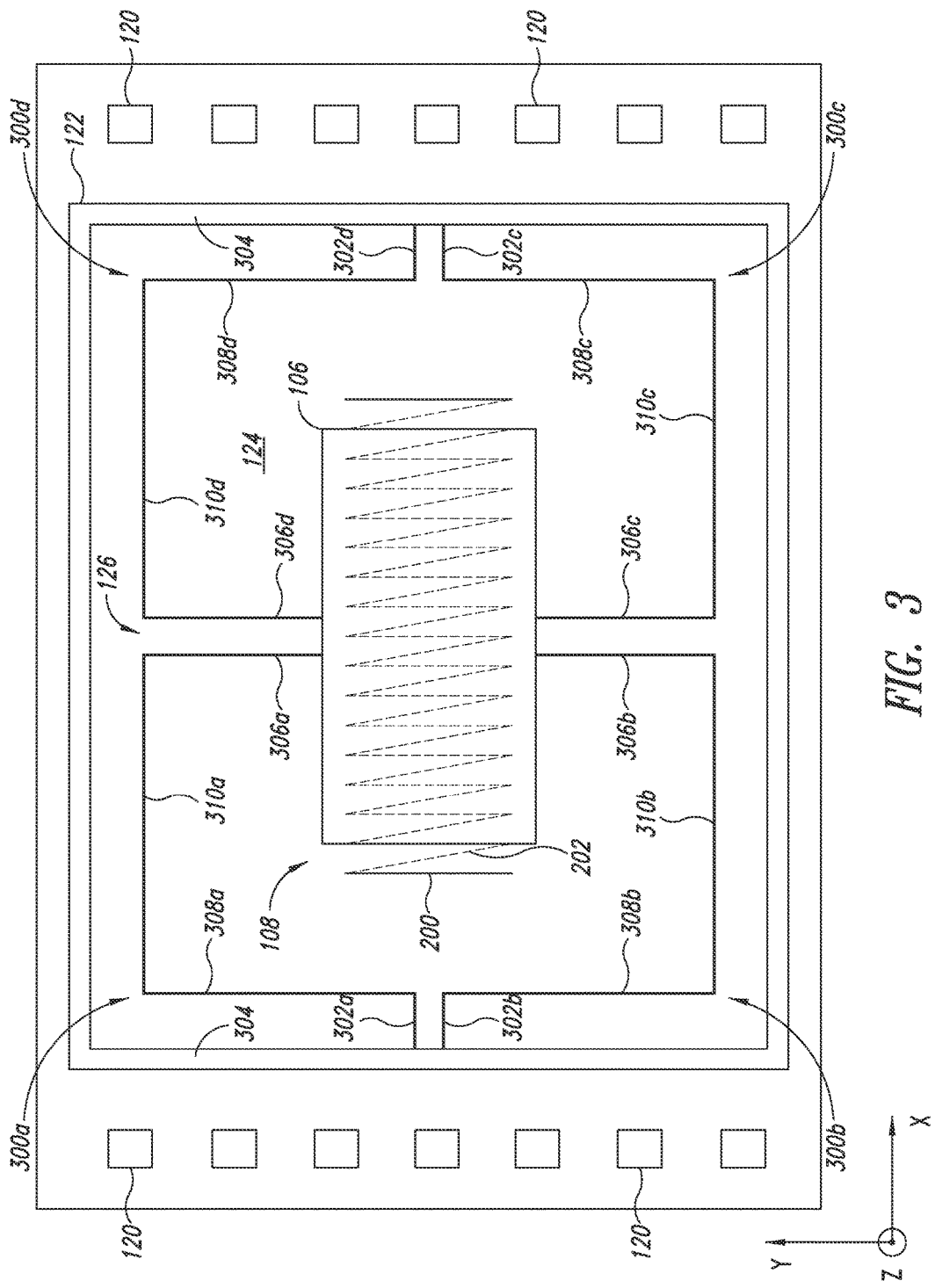
FIG. 3 is a top view illustrating a moveable mass of the MEMS device of FIG. 1 positioned over the EHS coil of FIG. 2.

FIG. 3 is a top view illustrating in more detail the supporting structure 126 that moveably suspends the moveable mass 106 over the EHS coil 108 of FIG. 2. The top view of FIG. 3 shows components contained within the internal cavity 124 of the MEMS device 102 with the top portion of the packaging structure 122 removed to expose the internal cavity. In the embodiment of FIG. 3, the supporting structure 126 has four springs or balancers or arms 300*a*-300*d*. Each arm 300*a*-300*d* has a first end 302*a*-302*d* coupled to a respective wall 304 of the packaging structure 122 (that is a frame in the section here shown in FIG. 3), where the walls 304 along with the top (not shown) form the internal cavity 124 of the MEMS device 102. Each arm 300*a*-300*d* further includes a second end 306*a*-306*d* coupled to the moveable mass 106. More specifically, although not expressly shown in FIG. 3, the second ends 306*a*-306*d* are coupled to the magnet support layer 112 of the moveable mass 106. The bonding pads 120 are also shown in FIG. 3 although only selected ones of these bonding pads are labeled with reference number 120 merely to simplify the figure.

In the embodiment of FIG. 3, the moveable mass 106 is a plate having a rectangular shape but in other embodiments different shapes may be utilized. Obviously the shape of supporting structure 126 depends on the shape of moveable mass 106. The respective first ends 302*a* and 302*b* of the arms 300*a* and 300*b* are coupled to the same wall 304 of the packaging structure 122. Likewise, the respective first ends 302*c* and 302*d* of the arms 300*c* and 300*d* are coupled to the same wall 304 of the packaging structure 122, where this wall is diametrically opposite to the 304 to which the first ends 302*a*, 302*b* of the arms 300*a*, 300*b* are coupled. Thus, the first ends of the arms 300*a* and 300*b* are coupled to the wall 304 on the left of FIG. 3 and the first ends of the arms 300*c* and 300*d* are coupled to the wall 304 on the right of FIG. 3. The respective second ends 306*a* and 306*d* of the arms 300*a* and 300*d* are coupled to the same side of the moveable mass 106, which is the top side in FIG. 3. The respective second ends 306*b* and 306*c* of the arms 300*b* and 300*c* are coupled to the same side of the moveable mass 106, which is the bottom side of the moveable mass 106. Thus, the second ends 306*a* and 306*d* are coupled to a sided of the moveable mass 106 that is diametrically opposite to the side of the moveable mass to which the second ends 306b and 306c are coupled.

Each arm 300a-300d further includes between the corresponding first ends 302a-302d and second ends 306a-306d respective first arm portions 308a-308d and second arm portions 310a-310d having preferred directions of extension orthogonal to one another. With reference to the axes represented in the lower left portion of FIG. 3, each of the first arm portions 308a-308d has a preferred direction of extension along the Y axis while the second arm portions 310a-310d each has a preferred direction of extension along the X axis.

In operation, when subjected to external forces or stresses acting along the X axis, such as the force of gravity for example, the moveable mass 106 is set in motion along the X axis by the supporting structure 126. In particular, the arm portions 308a-308d of the respective arms 300a-300d undergo deformation by bending in such a way as to enable displacement of the moveable mass 106 along the X axis. Likewise, when the moveable mass 106 is subjected to external forces or stresses acting along the Y axis, the arm portions 310a-310d of the respective arms 300a-300d undergo deformation by bending in such a way as to enable a displacement of the moveable mass 106 along the Y axis. For external stresses having force components along both the X axis and along the Y axis, both of the arm portions 308a-d and 310a-d are deformed accordingly to set the moveable mass 106 in motion under the action of the applied external force. The arms 300a-300d also enable movement of the moveable mass 106 along the Z axis, which is in the direction into and out of the page in the top view of FIG. 3. In this situation, both of the arm portions 308a-d and 310a-d of the arms 300a-d undergo deformation, meaning they bend, in the direction of the Z axis so as to allow movement of the moveable mass 106 along the Z axis.

The arms 300a-300d and the moveable mass 106 may be produced in the same etching step during manufacturing of the MEMS device 102. More specifically, the arms 300a-300d and the magnet support layer 112 may be formed through the same etching step. In this case, the magnet support layer 112 of the moveable mass 106 and the arms 300a-300d are made of the same material, and no discontinuities are present between the magnetic support layer and the arms.

The moveable mass 106 includes the permanent magnet layer 114 attached to the magnet support layer 112. The permanent magnet layer 114 is made of a suitable permanent magnetic material as previously discussed, and may be formed on or attached to the magnetic support layer 112 through any suitable techniques, as will be appreciated by those skilled in the art. The specific arrangement of the permanent magnet layer 114 on the magnet support layer 112 varies in different embodiments of the moveable mass 106 and EHS coils 108, as will be described in more detail below. Other characteristics of the permanent magnet layer 114 also vary in different embodiments of the moveable mass 106, such as the thickness of the permanent magnet material which depends, at least in part, on the type of magnetic material used and upon the characteristics of the selected material.

In the embodiment of FIG. 1, the permanent magnet layer 114 is formed on one side of the magnet support layer 112 of the moveable mass 106 using any suitable techniques such as deposition, sputtering, electrochemical deposition, chemical vapor deposition, physical vapor deposition, electroless deposition/plating, aerosol jet printing/deposition, and electron beam deposition. More specifically, the permanent magnet layer 114 is formed on the lower or bottom side, or the side of the magnet support layer 112 facing the upper surface 118a of the structural support layer 118, and the EHS coil 108. Although the permanent magnet layer 114 extends only on the bottom side of the magnet support layer 112 in the embodiment of FIG. 1, the permanent magnet layer can alternatively extend on the top side of the magnet support layer, or on both the top and bottom sides of the magnet support layer, and can extend through the magnet support layer in alternative embodiments. In addition, according to further embodiments, the permanent magnet layer 114 includes multiple layers of magnetic materials, possibly alternating with layers of insulating materials, such as oxide like silicon oxide, or the permanent magnet layer 114 may be a discrete permanent magnet attached to the magnet support layer 112 using for example an adhesive layer or a glue (here not shown).

Figure 4:
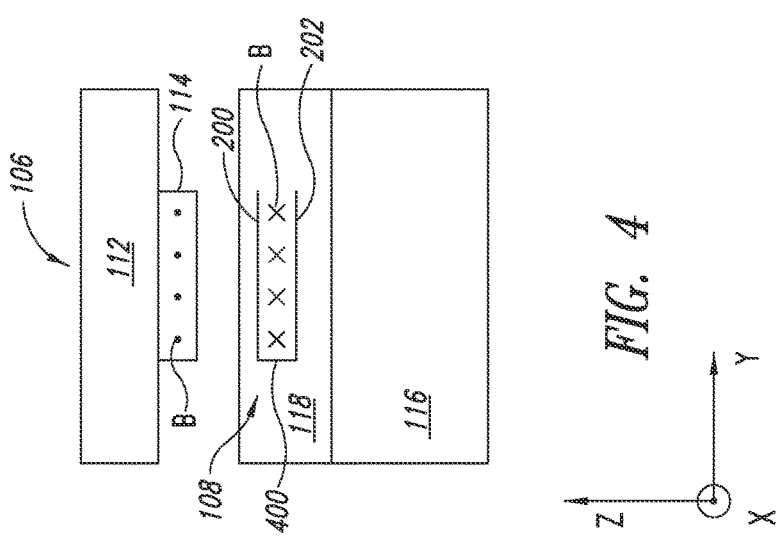
FIG. 4 is a cross-sectional view illustrating the structure of the moveable mass and the EHS coil of FIG. 3 and the magnetic coupling between these two components.

FIG. 4 is a cross-sectional view of the movable mass 106 and the EHS coil 108 of FIGS. 1-3 and illustrates the magnetic coupling of the two through the magnetic field B. In the structural layer 118 the conductive traces 200 and 202 (FIG. 2) are shown and are interconnected through vias 400 to thereby form turns N of the EHS coil 108. Thus, multiple vias 400 interconnect corresponding pairs of traces 200,202 to form the EHS coil 108 having N-turns where N is the number of pairs of traces 200, 202. The X axis component of the magnetic field B generated by the permanent magnet layer 114 is the component of the magnetic field that results in energy generation in the EHS coil 108 (i.e., the component of the magnetic field B that is orthogonal to the YZ plane of the cross-section of FIG. 4. The magnetic field B is shown through dots in the permanent magnet layer 114 indicating the field extends along the X axis coming out of the page. Conversely, the magnetic field B is shown through X's in the EHS coil 108 indicating the field extends along the X axis but going into the page in the YZ plane cross-section of FIG. 4. Movement of the moveable mass 106 in the three dimensions XYZ results in changes in the magnetic flux through the YZ plane and thus through the EHS coil 108, resulting in energy generation in the EHS coil as previously mentioned.

Figure 5:
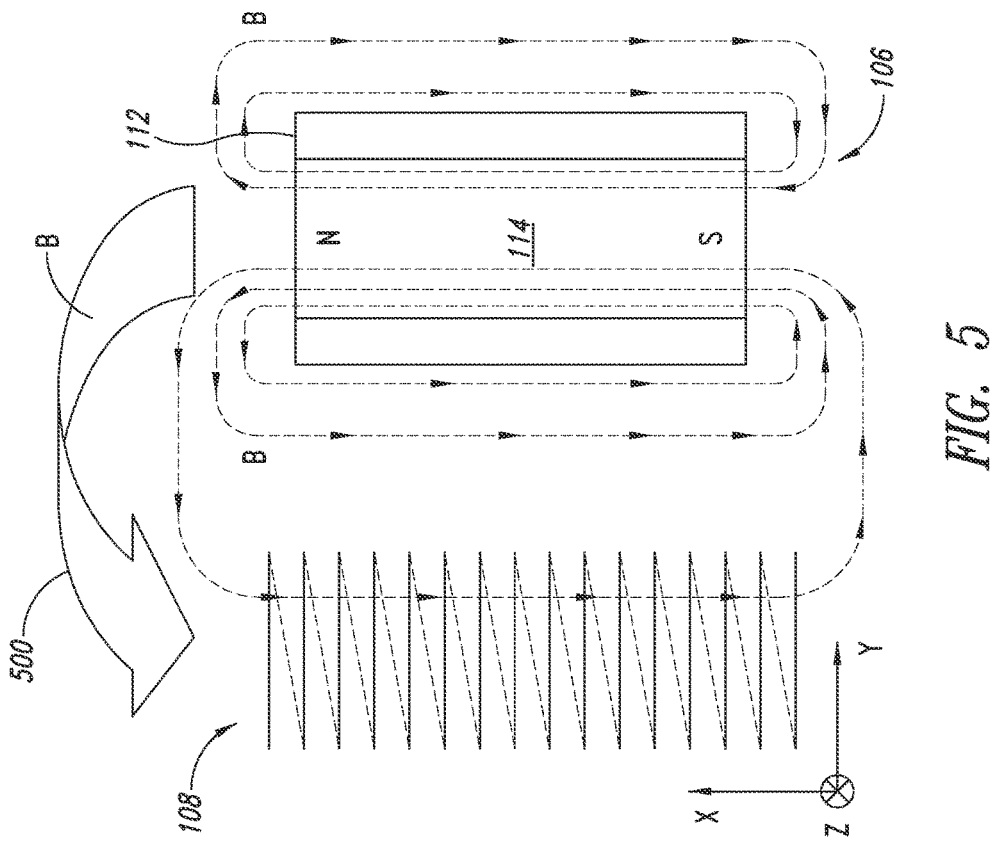
FIG. 5 is a bottom view of the moveable mass of FIGS. 1 and 3 and functionally illustrates the magnetic coupling between the moveable mass and the EHS coil of FIG. 3.

FIG. 5 is a bottom view of the moveable mass 106 and illustrates the magnetic coupling between the permanent magnet layer 114 of the moveable mass and the EHS coil 108 of FIG. 3. The magnetic field B generated by the permanent magnet layer 114 of the moveable mass 106 is shown through dotted lines and through the arrow 500 at the top of the figure. In this example, the permanent magnet layer 114 extends along the length of the magnet support layer 112 in the X axis direction, and extends along a width of the magnet support layer in the Y axis direction. The width of the permanent magnet layer 114 is smaller than the width of the magnet support layer 112 in the embodiment of FIG. 5.

The embodiment of the moveable mass 106, supporting structure 126, and EHS coil 108 just described with reference to FIGS. 1-5 is a non-limiting embodiment of the present disclosure. Other embodiments of the moveable mass 106, supporting structure 126 including the arms 300a-300d, and the EHS coil 108 can be utilized. For example, the moveable mass 106 may have any suitable shape and is not limited to the square or rectangular shapes of FIGS. 1-5. Furthermore, different arrangements or patterns of the permanent magnet layer 114 are possible in different embodiments of the present disclosure. Several such alternative embodiments of the EHS coil 108, moveable mass 106, and permanent magnet layer 114 will be discussed in more detail below.

In some embodiments of the MEMS device 102, the structure of the MEMS device is substantially similar to the mechanical structure of the MEMS device that is part of the magnetic inertial sensor described in U.S. Patent Application Publication No. US2013/0255381 A1, which was filed on Apr. 1, 2013 and which is incorporated by reference herein in its entirety.

Figure 6:
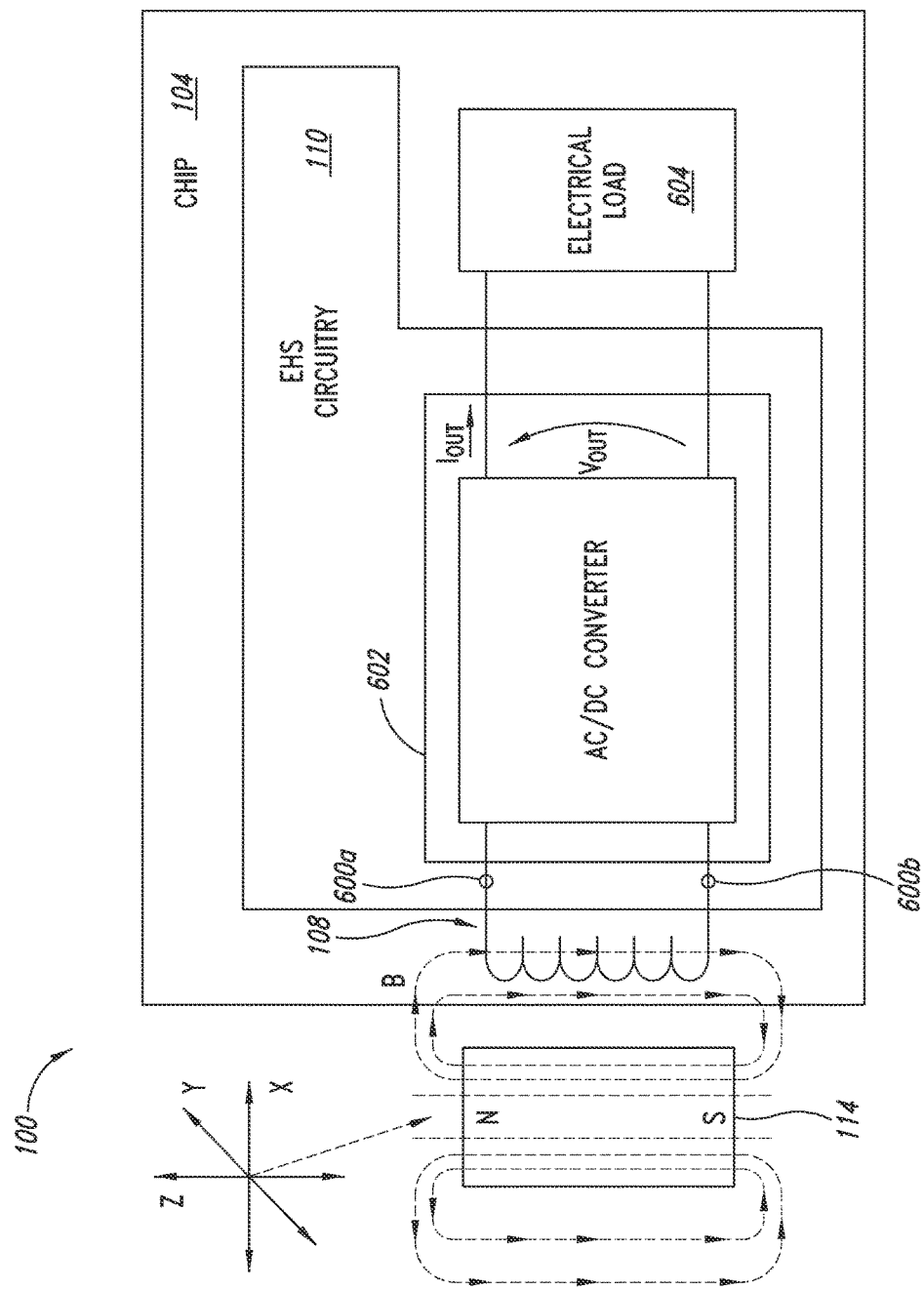
FIG. 6 is a functional diagram illustrating the operation of the embodiment the magnetic EHS device of FIGS. 1-5.

FIG. 6 is a functional diagram illustrating the operation of the magnetic EHS device 100 of FIGS. 1-5. In operation, external forces applied to an electronic device including the magnet EHS device 100 result in movement of the moveable mass 106 (FIG. 1) and thereby movement of the permanent magnet layer 114 relative to the EHS coil 108. This movement of the layer 114 can occur in three dimensions, namely along and X axis, Y axis, and Z axis as previously mentioned and as once again represented through these three axes shown in the upper left portion of FIG. 6. This movement of the permanent magnet layer 114 results in changes in the flux of the magnetic field B through the EHS coil 108 and these changes in magnet flux cause electrical energy to be generated in the EHS coil 108. The EHS coil 108 generates magnetic energy and supplies an electrical voltage across and current through terminals 600a and 600b of the EHS coil based on the generated magnetic energy. The generated magnetic energy in the EHS coil 108 varies as a function of time as the flux of the magnetic field B through the coil varies over time due to the movement of the permanent magnet layer 114. As a result, the electrical voltage across and current through the terminals 600a, 600b of the EHS coil 108 also vary as a function of time.

An AC/DC converter 602 contained in the EHS circuitry 110 is coupled across the terminals 600a, 600b of the EHS coil 108 to receive the time varying voltage and current from the EHS coil 108. The AC/DC converter 602 generates a DC output voltage Vout and a DC output current Iout from the time varying voltage and current from the EHS coil 108 and supplies this output voltage and current to drive an electrical load 604. The electrical load 604 may be contained in the first semiconductor chip 104 as shown in FIG. 6 or may be external to the chip, and for example it may be another electronic system or an energy storage device like a battery. One skilled in the art will understand various suitable circuits that may be utilized for forming the AC/DC converter 602. For example, the AC/DC converter 602 may include rectification circuitry that rectifies the time varying or AC voltage and current from the EHS coil 108 to generate a rectified voltage that is then applied to a capacitive circuit to filter this rectified voltage and store electrical energy to thereby provide the output voltage Vout and current Iout from the AC/DC converter. The term "AC" is used to indicate a signal or quantity that is alternating or varying over time while the term "DC" is used to indicate a signal or quantity that is relatively constant over time, as will be appreciated by those skilled in the art. Thus, the time varying voltage and current from the EHS coil 108 are AC signals while the output voltage Vout and current Iout are DC signals.

Figure 7A:
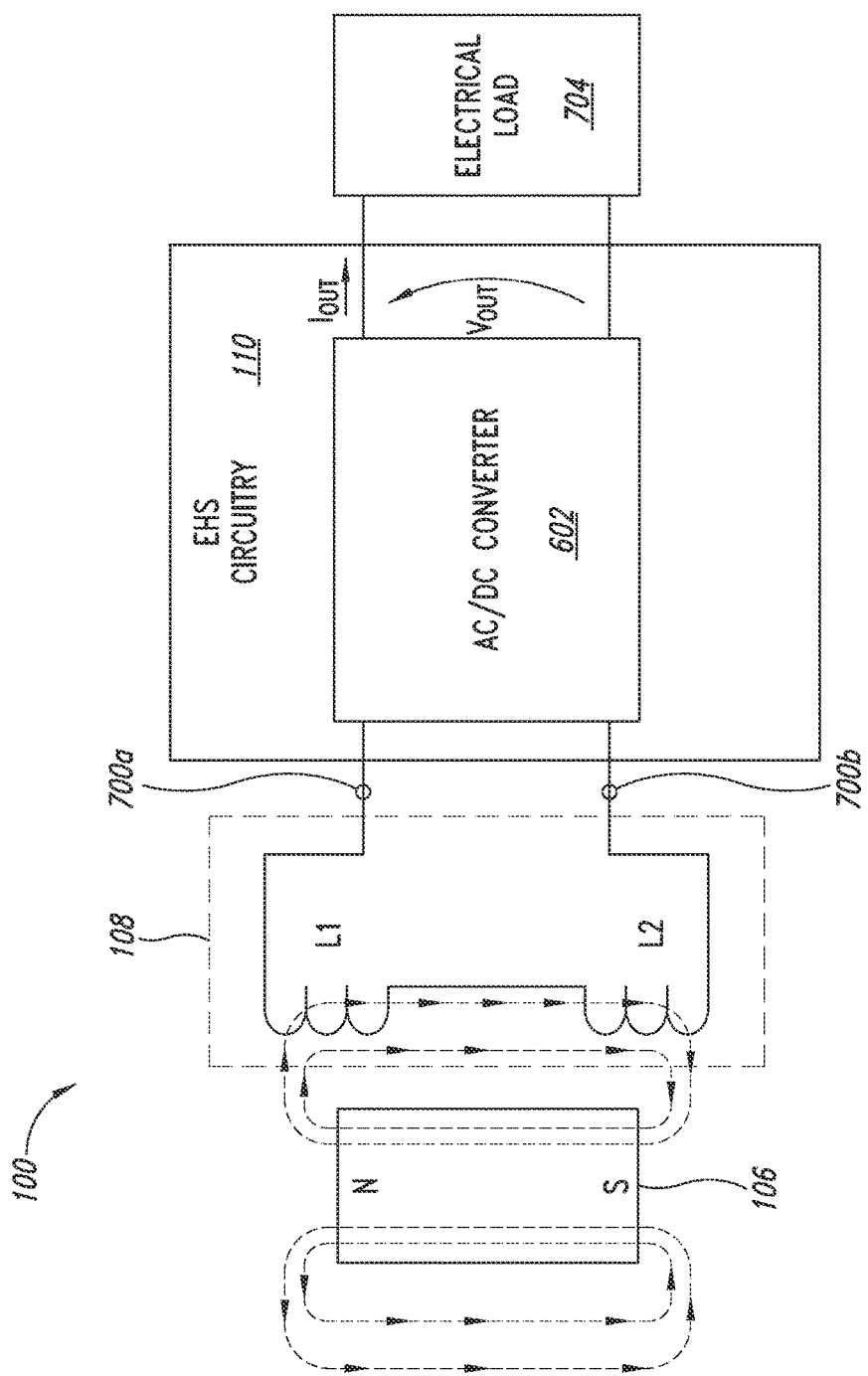
FIG. 7A is a functional and schematic diagram illustrating another embodiment of a magnetic EHS device that includes two EHS coils coupled in series.

FIG. 7A is a functional and schematic diagram illustrating another embodiment of the magnetic EHS device 100 where the EHS coil 108 is formed by two EHS inductors or coils L1 and L2 that are coupled in series. These series-connected inductors L1, L2 would be formed in or on the structural layer 118 of the first semiconductor chip 104, or on a passivation layer thereof, as discussed above with reference to FIG. 1. The AC/DC converter 602 contained in the EHS circuitry 110 is coupled across terminals 700a, 700b of the series-connected EHS coils L1, L2 to receive the time varying voltage and current from the EHS coils that are generated responsive to varying flux of the magnetic field B responsive to movement of the permanent magnet layer 114, as discussed in more detail above with regard to FIG. 6. The AC/DC converter 602 once again generates a DC output voltage Vout and a DC output current Iout from the time varying or AC voltage and current from EHS coils L1, L2 and supplies this output voltage and current to drive an electrical load 704.

Figure 7B:
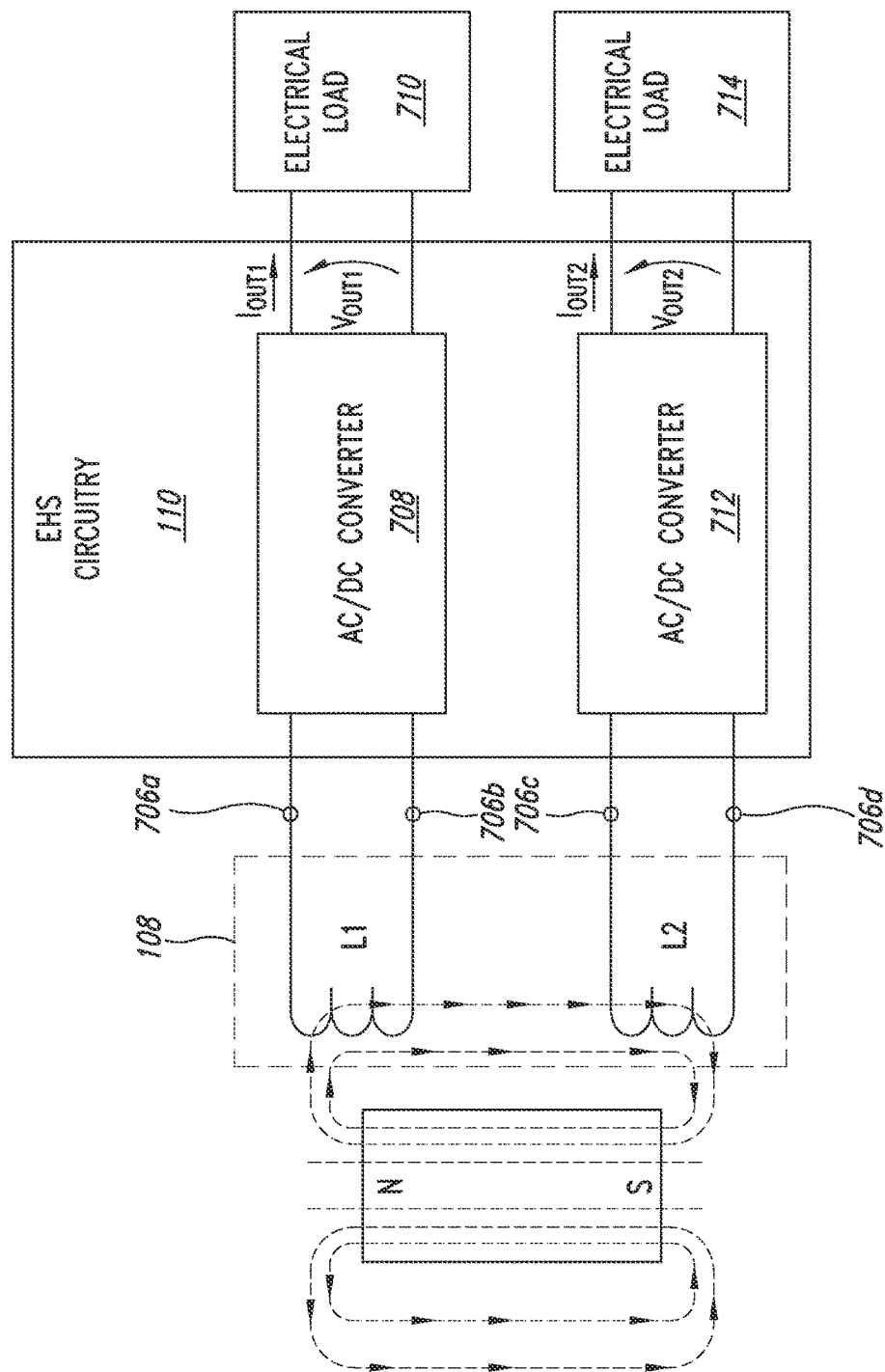
FIG. 7B is a functional and schematic diagram illustrating another embodiment of a magnetic EHS device that includes two EHS coils.

FIG. 7B is a functional and schematic diagram illustrating another embodiment of the magnetic EHS device 100 where the EHS coil 108 is formed by two EHS inductors or coils L1 and L2 that are independent. The first one of these inductors L1 includes terminals 706a, 706b that are coupled to a first AC/DC converter 708 contained in the EHS circuitry 110. The AC/DC converter 708 generates a DC output voltage Vout1 and current Iout1 that drive a first electrical load 710. Similarly, the inductor L2 includes terminals 706c, 706d that are coupled to a second AC/DC converter 712 that generates a DC output voltage Vout2 and current Iout2 that drive a second electrical load 714. In a variation (not shown), inductors L1 and L2 may be coupled in parallel to a single AC/DC converter. In another variation (not shown), the AC/DC converters 708, 712 may be coupled in series or in parallel to a single electrical load.

Figure 8B:
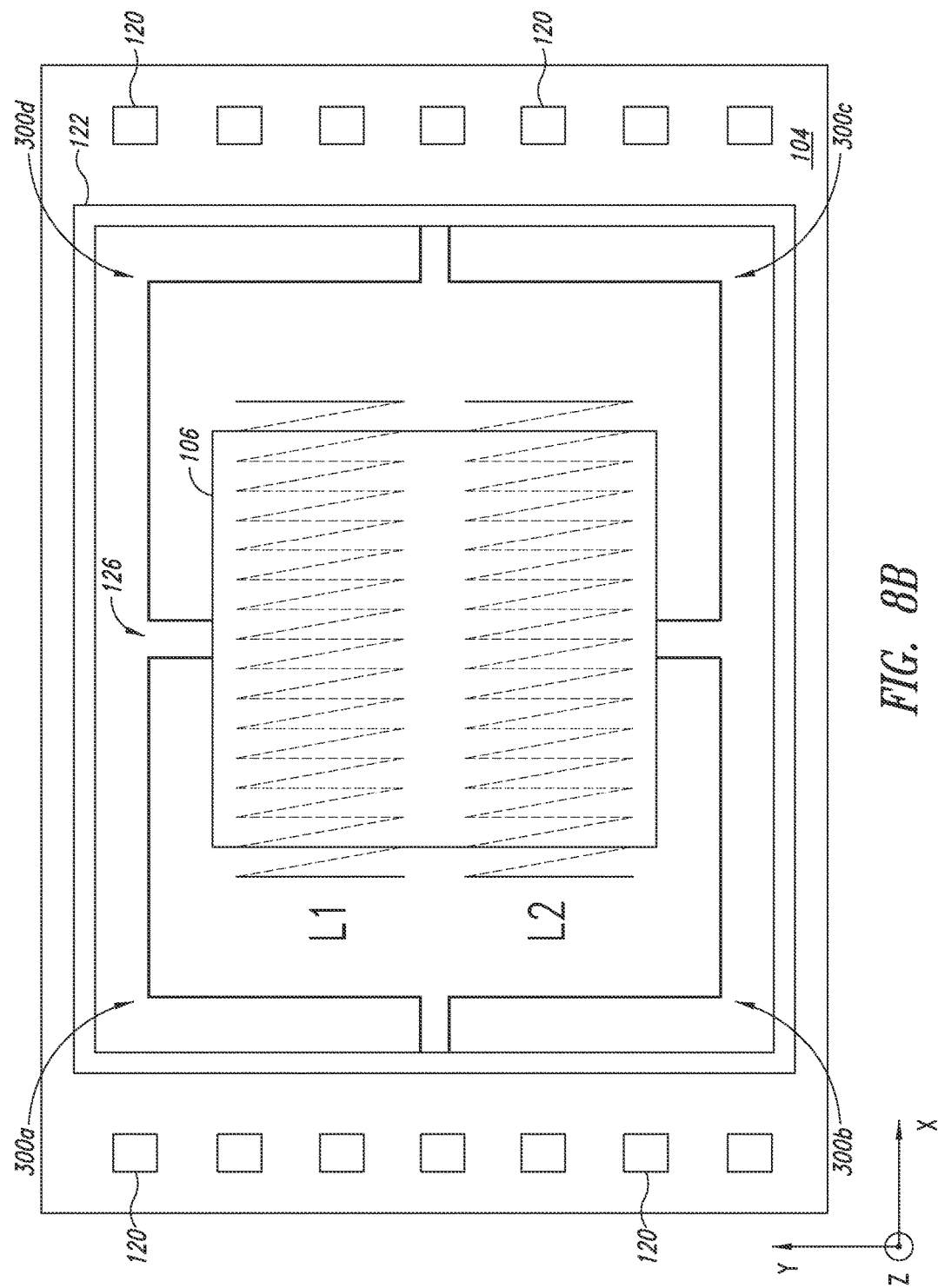
FIG. 8B is a top view illustrating a moveable mass positioned over the EHS coils of FIGS. 7A, 7B, and 8A.

FIG. 8A is a top view of the first semiconductor chip 104 including the two EHS coils L1, L2 of the embodiments of FIGS. 7A and 7B. As in the previously described embodiment of FIG. 3, in the embodiment of FIG. 8A the EHS coils L1 and L2 have longitudinal axes extending along the X axis as illustrated and are formed adjacent one another in the structural layer 118 of the first semiconductor chip 104. FIG. 8B is a top view illustrating the moveable mass 106 positioned over the EHS coils of FIG. 8A. In the embodiment of FIG. 8B, the movable mass 106 is positioned over the EHS coils L1 and L2 through the arms 300a-d of the supporting structure 126 as described in detail above with reference to FIG. 3. In the embodiments of FIGS. 7A, 7B, 8A and 8B the EHS coils L1 and L2 are formed in or on the structural layer 118 (FIG. 1) of the first semiconductor chip 104, or on a passivation layer thereof, as discussed above with reference to FIG. 1.

Figure 9A:
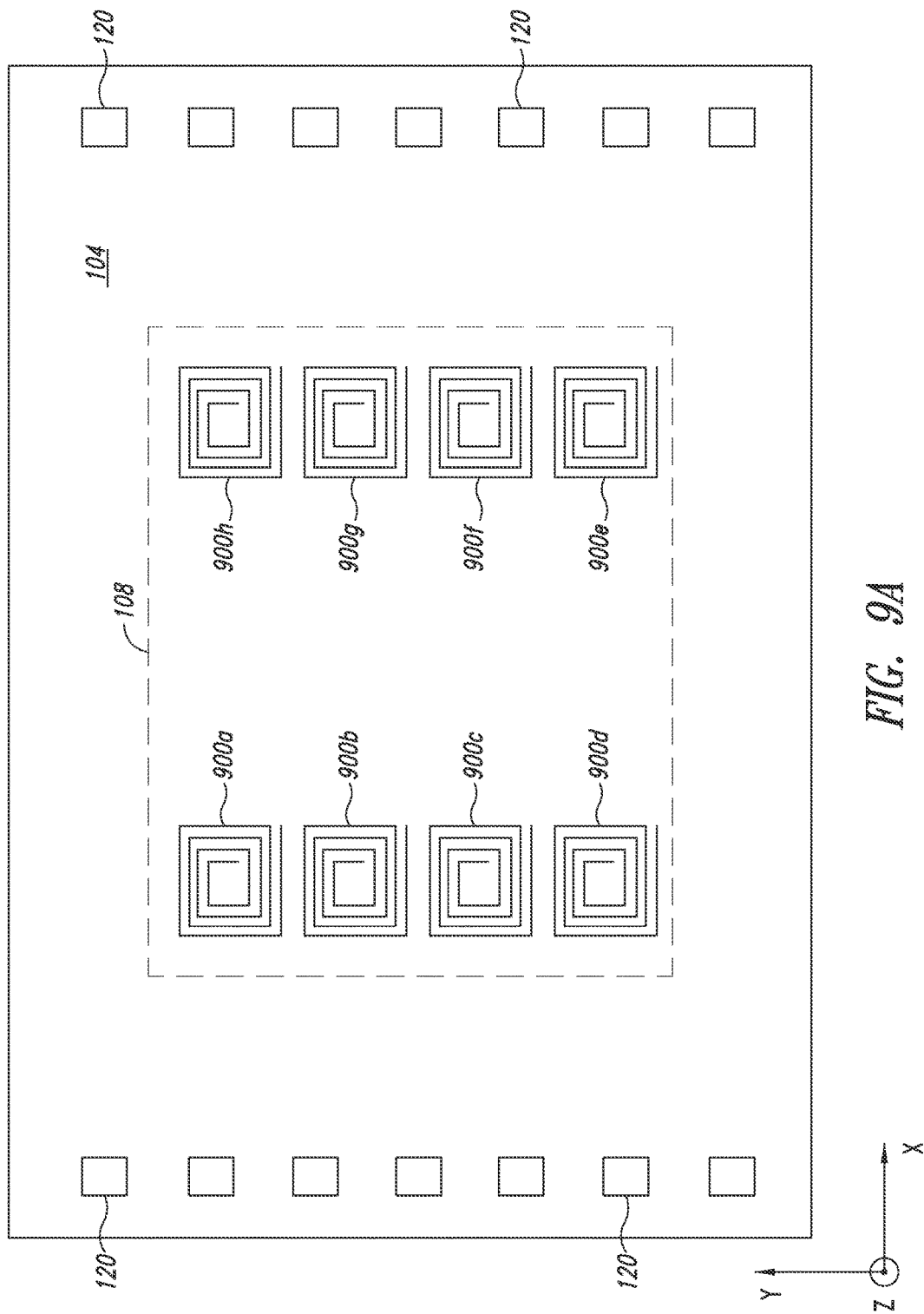
FIG. 9A is a top view of a first semiconductor chip that includes a number of horizontally-arranged EHS coils according to another embodiment of the present disclosure.

FIG. 9A is a top view of the first semiconductor chip 104 that includes a number of horizontally-arranged EHS coils 900a-h forming the EHS coil 108 (see FIG. 1) according to another embodiment of the present disclosure. The EHS coils 900a-h are spiral coils in the illustrated embodiment but may have other configurations in alternative embodiments. These EHS coils 900a-h are termed "horizontally-arranged" because the coils are in the XY plane defined by the X and Y axes as shown in the lower left corner of the figure. As a result, a "vertically-oriented" magnetic field B including a component along the Z axis and thus a component perpendicular to the XY plane will result in flux through the EHS coils 900a-h. This is in contrast to the embodiments of the EHS coil 108 of FIGS. 1-8 in which magnetic flux through the EHS coil had to be parallel to the X axis or perpendicular to the YZ plane as illustrated in FIG. 4. Embodiments of the permanent magnet layer 114 of the movable mass 106 for generating such a vertically-oriented magnetic field B are described in more detail below. No vias are required to form the with EHS coils 900a-h and these coils may also have a larger cross-section or area in the XY plane such that more flux of the magnetic field B through the coils may result in more magnetic energy stored in the coils and thus more electrical energy generated with this embodiment.

Figure 9B:
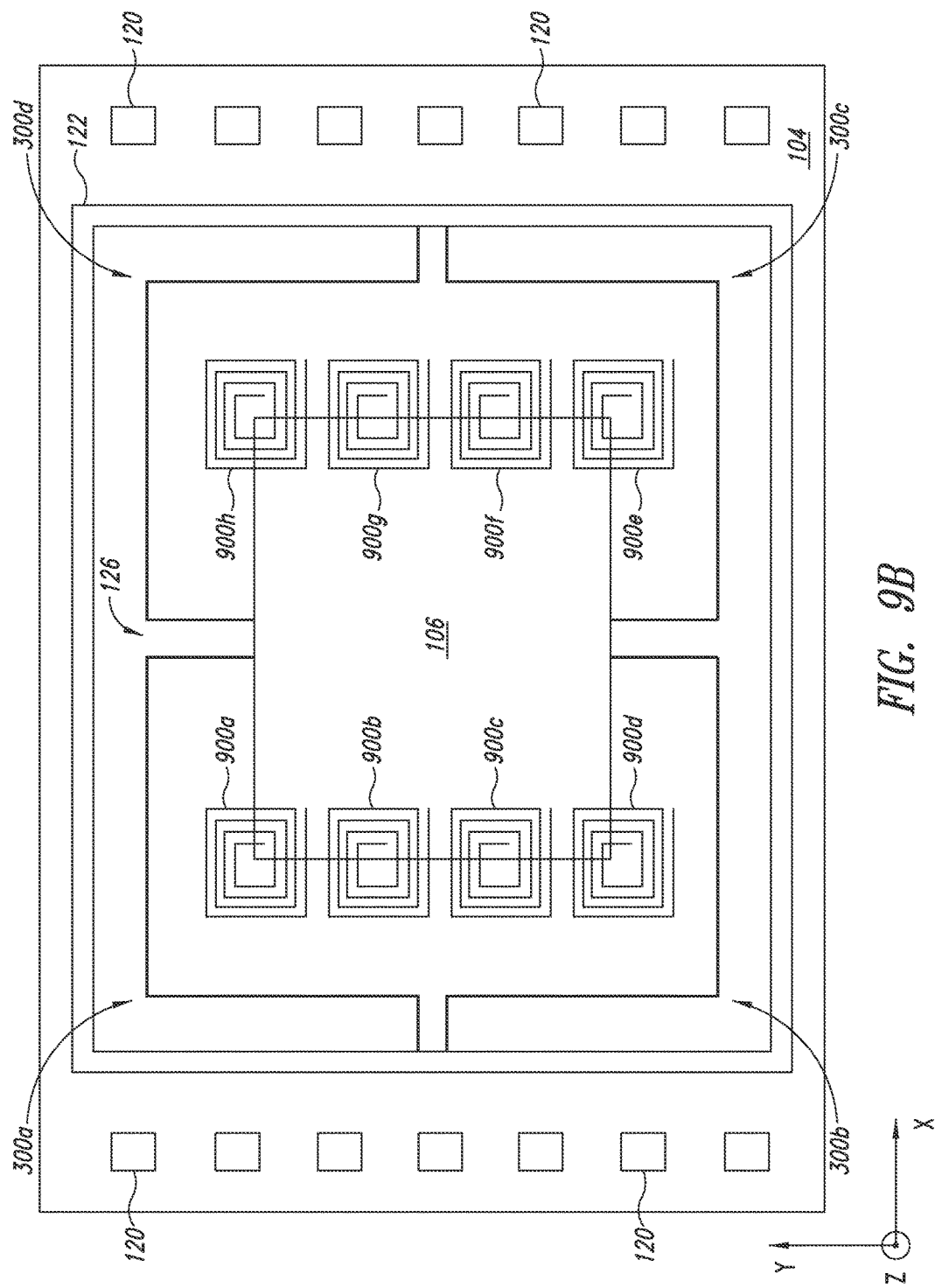
FIG. 9B is a top view illustrating the embodiment of FIG. 9A with a moveable mass positioned over the horizontally-arranged EHS coils.

FIG. 9B is a top view illustrating the embodiment of FIG. 9A with the moveable mass 106 positioned over the horizontally-arranged EHS coils 900a-h. The movable mass 106 is positioned over the EHS coils 900a-h through the arms 300a-d of the supporting structure 126 as described in more detail above with reference to FIG. 3. The moveable mass 106 only partially covers the EHS coils 900a-h with the outer edges of the movable mass. Such an arrangement may result in larger changes in magnetic flux of the magnetic field B through the EHS coils 900a-h due to movement of the movable mass 106. Changes in magnetic flux of the magnetic field B are what result in magnetic energy being stored in the EHS coils 900a-h and not merely magnetic flux through the coils, as will be appreciated by those skilled in the art. Thus, for example, if an additional EHS coil 900 was located under and directly in the center of the movable mass 106, movement of the movable mass, at least in the XY plane, may result in significantly smaller changes in magnetic flux through this additional EHS coil than through the illustrated EHS coils 900a-h for the same movement of the movable mass. As will be described in more detail below, both the arrangement of the coil or coils forming the EHS coil 108 (FIG. 1) and the arrangement or structure of the permanent magnet layer 114 that affect the magnet energy that may be captured in the EHS coil responsive to movements of the moveable mass 106.

The EHS coils 900a-h may be coupled in series or parallel to associated EHS circuitry 110 (not shown in FIGS. 9A and 9B). Moreover, groups of the EHS coils 900a-h may be interconnected in series or parallel and coupled to a corresponding AC/DC converter contained in the EHS circuitry 110 as described with reference to the embodiment of FIGS. 7A and 7B. Some groups of EHS coils 900a-h may be coupled in parallel while others are coupled in series and coupled to corresponding AC/DC converters contained in the EHS circuitry 110.

FIG. 10A is a top view of the first semiconductor chip 104 that once again includes a number of horizontally-arranged EHS coils 1000a-1000p according to a still further embodiment of the present disclosure. The inclusion of additional EHS coils 1000 in the embodiment of FIG. 10A will increase the magnetic flux of the magnetic field B through the coils collectively when compared to the embodiment of FIG. 9A. As a result, the total amount of magnetic energy that may be stored in the EHS coils 1000a-p may be greater than that stored in the coils 900a-h in the embodiments of FIGS. 9A and 9B. This additional stored magnetic energy stored collectively in the EHS coils 1000a-p may be converted into a greater amount of electrical energy for use in powering electronic circuitry (not shown).

Figure 10B:
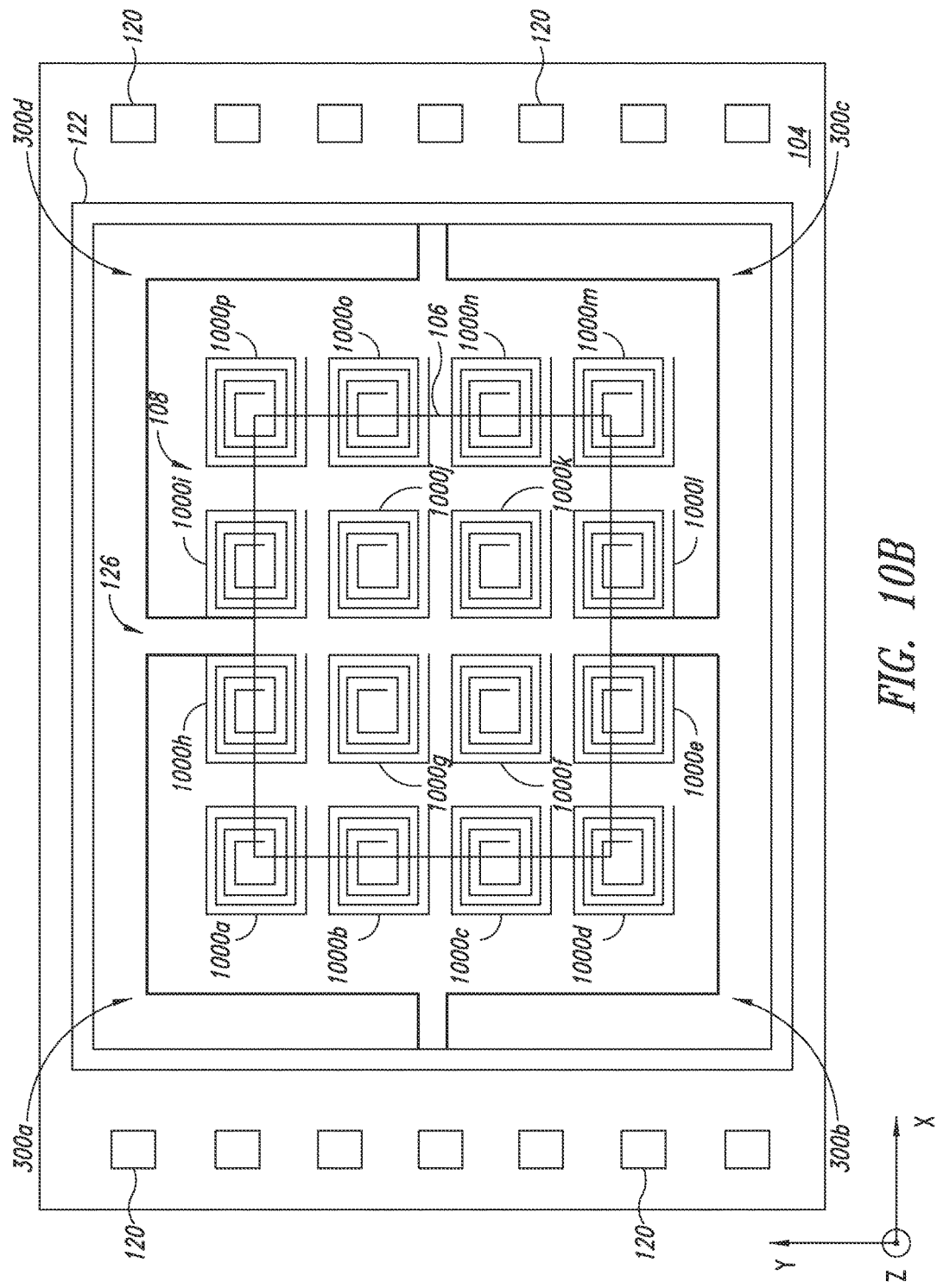
FIG. 10B is a top view illustrating the embodiment of FIG. 10A with a moveable mass positioned over the horizontally-arranged EHS coils.

FIG. 10B is a top view illustrating the embodiment of FIG. 10A with the moveable mass 106 positioned over the horizontally-arranged EHS coils 1000a-1000p. Only some of the EHS coils 1000a-1000p are labeled in FIG. 10B to simplify the figure. Once again, movement of the movable mass 106 results in changes in the flux of the magnetic field B through the EHS coils 1000a-p and that is stored as magnetic energy in the coils and then converted and stored as electrical energy by the EHS circuitry 110 of FIG. 7A or 7B or other suitable EHS circuitry. As described with reference to the embodiment of FIGS. 9A and 9B, the EHS coils 1000a-p may be coupled in series or parallel to the associated EHS circuitry 110. Moreover, groups of the EHS coils 1000a-p may be interconnected in series or parallel, or both, and coupled to a corresponding AC/DC converter contained in the EHS circuitry 110 as described with reference to the embodiment of FIGS. 7A and 7B. The moveable mass 106 has a smaller area in the XY plane than do the EHS coils 1000a-p in this embodiment, which may improve the changes in magnet flux through the peripheral EHS coils responsive to movements of the mass and thereby increase the magnetic energy stored in such coils and thus the total electrical energy captured through this embodiment.

Figure 10C:
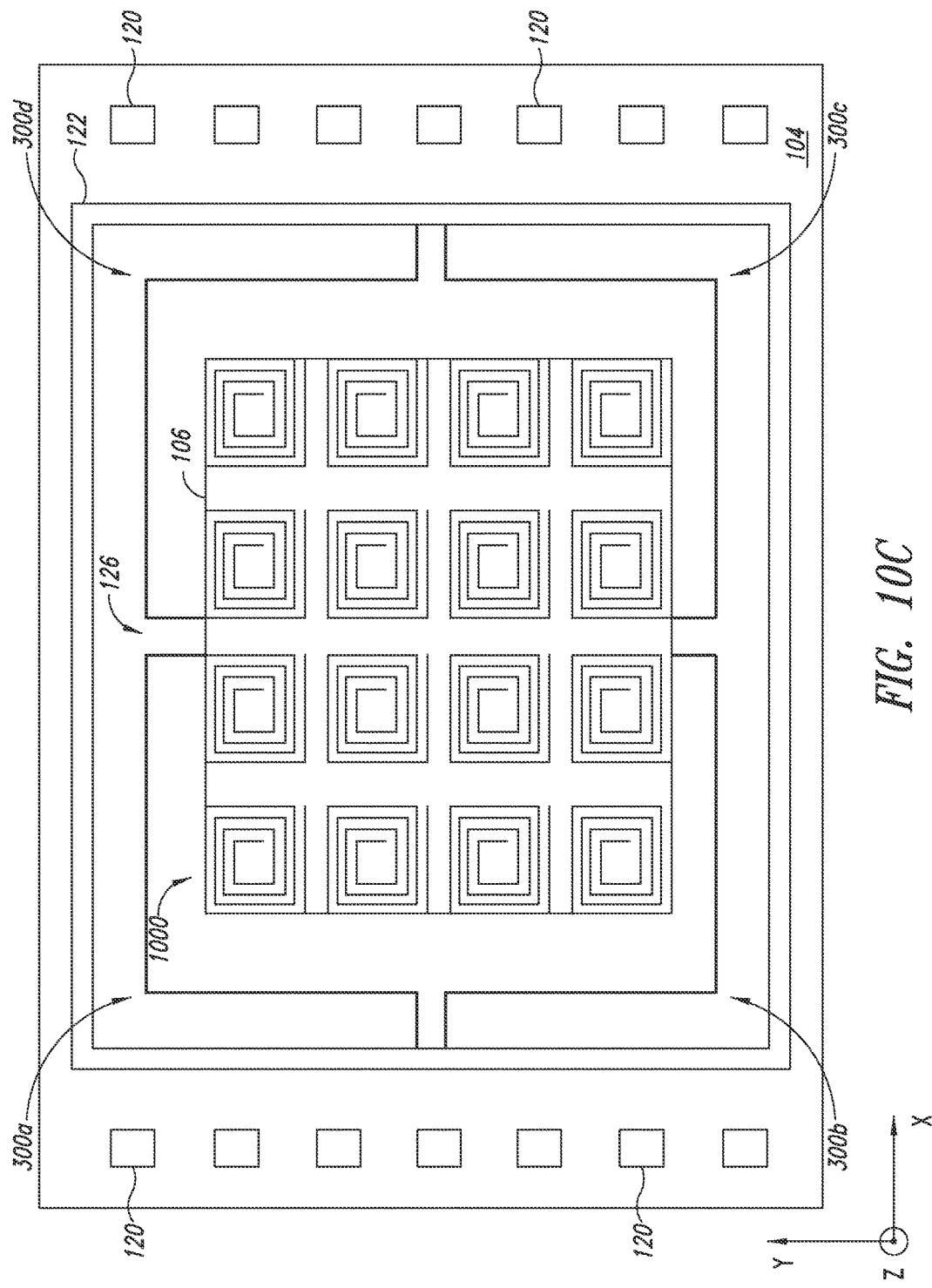
FIG. 10C is a top view illustrating the embodiment of FIG. 10A with a larger moveable mass positioned over the horizontally-arranged EHS coils.

FIG. 10C is a top view illustrating the embodiment of FIG. 10A where the moveable mass 106 is larger than the moveable mass in the embodiment of FIG. 10B. The moveable mass 106 in this embodiment has an area in the XY plane that is approximately the same as that of the horizontally-arranged EHS coils 1000a-p such that the mass effectively "covers" the coils in the view of FIG. 10C. The EHS coils 1000a-p are indicated generally as 1000 in the figure. This larger moveable mass 106 may be advantageous in that it provides a larger surface on which to dispose or arrange the permanent magnet layer 114 (not shown in FIG. 10C) to improve the magnetic energy capture of the EHS coils responsive to movements of the moveable mass. Several possible embodiments of arrangements of the EHS coils 1000 and the permanent magnet layer 114 are described in more detail below in relation to other embodiments of the present disclosure.

Several embodiments of the EHS coil 108 have been described above with reference to FIGS. 1-10. FIG. 11A is a bottom and cross-sectional view of another embodiment of the moveable mass 106 that may be utilized in any of the prior embodiments of FIGS. 1-10.

FIG. 11A is a bottom and cross-sectional view of another embodiment of the moveable mass 106 that may be utilized in any of the prior embodiments of FIGS. 1-10. In this embodiment, the permanent magnet layer 114 includes two permanent magnet strips or segments 1100a and 1100b that are spaced apart and attached to the bottom surface of the magnet support layer 112. In this embodiment, each of the segments 1100a-b are spaced apart along the Y axis direction and positioned parallel one another in the X axis direction, extending the full length of the magnet support layer 112 in the X axis direction. Each of the segments 1100a-b is an individual magnet and is horizontally-oriented in that the north pole N in south pole N of each magnet is in the XY plane. Moreover, in this embodiment the segments 1100a-b are arranged with the north pole N of each segment positioned adjacent north pole N of the other segment in the same for the south poles S, as seen figure. The magnetic field B generated by the segments 1100a-b is represented through the dotted lines in the figure. Although not illustrated the magnetic field B would also include vertical components along the Z axis extending into and out of the page in FIG. 11A.

FIG. 11B is a bottom view of yet another embodiment of the moveable mass 106 that is the same as the embodiment of FIG. 11A except that this embodiment includes to magnetic segments 1102a and 1102b attached to the bottom surface of the magnet support layer 112 with the north poles N and south poles S of the segments being anti-parallel. Thus, the north pole N of the magnetic segment 1102a is positioned adjacent the south pole S of the magnetic segment 1102b, and the same for the other poles of each of the segments. Once again the magnetic field B generated by the segments 1102a-b is represented through the dotted lines in the figure and would also include vertical components along the Z axis although not shown in figure. Although the embodiments of FIGS. 11A and 11B each include only two magnetic segments 1100*a-b*, 1102*a-b*, other embodiments include a single segment or more than two segments. Moreover, multiple magnetic segments may be arranged in different ways on the magnet support layer 112 need not be aligned.

FIGS. 11A and 11B illustrate how different configurations of the permanent magnet layer 114 arranged on the magnet support layer 112 may be utilized to generate different magnetic fields B. In this way the magnetic fields B generated by the permanent magnet layer 114 may be controlled or varied so as to more efficiently couple with the EHS coil 108 (FIG. 1) that is being utilized in a particular magnetic EHS device 100. Coupling is said to be more "efficient" in the sense that the magnetic field B generated by the permanent magnet layer 114 causes larger changes in magnetic flux through the associated EHS coil 108 to thereby increase the magnetic energy stored in the coil responsive to movements of the permanent magnet layer via movement of the movable mass 106.

Figure 12:
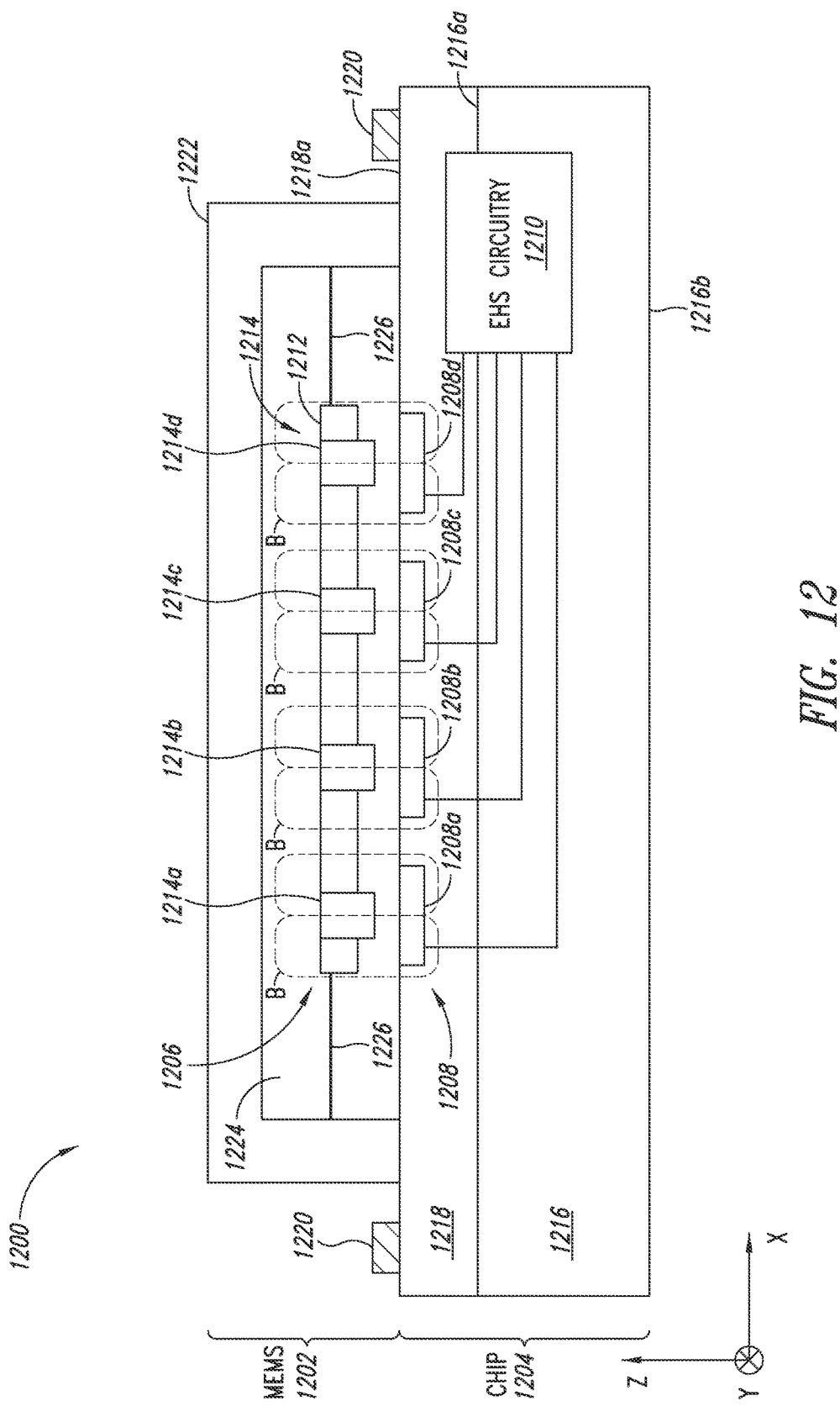
FIG. 12 is a cross-sectional diagram of a magnetic EHS device where the moveable mass includes a permanent magnetic layer having a number of vertically-oriented permanent magnets according to yet another embodiment of the present disclosure.

FIG. 12 is a cross-sectional diagram of a magnetic EHS device 1200 including a MEMS device 1202 and a first semiconductor chip 1204 according to another embodiment of the present disclosure. The components 1202-1226 of the magnetic EHS device 1200 correspond respectively to the components 102-126 in the magnetic EHS device 100 of FIG. 1. The structure of some of the components 1202-1226 is different than that of the corresponding component 102-126, however, as will now be described in more detail. In the embodiment of FIG. 12, the EHS coil 1208 includes a number of individual EHS coils 1208*a-d*. Similarly, the permanent magnet layer 1214 includes a number of individual permanent magnet segments 1214*a-d* positioned vertically adjacent the EHS coils 1208*a-d*, respectively. The permanent magnet segments 1214*a-d* are vertically-oriented permanent magnets in the embodiment of FIG. 12, meaning that the poles of the segments are vertically oriented along the Z axis. This is indicated through the dotted lines representing the magnetic field B generated by each of the permanent magnet segments 1214*a-d*. In this embodiment, the EHS coils 1208*a-d* may be spiral coils such as the coils 900 in the embodiment of FIG. 9A and other previously described embodiments. The vertical orientation of the permanent magnet segments 1214*a-d* helps increase the vertical component of the magnetic field B, namely the component along the Z axis, thereby increase changes in flux through the EHS coils 1208*a-d* responsive to movements of the movable mass 1206.

The permanent magnet segments 1214*a-d* are formed through the magnet support layer 1212 in the embodiment of FIG. 12 instead of being formed on the bottom surface of the magnet support layer as in FIG. 1. Suitable methods of forming such a structure will be understood by those skilled in the art. For example, holes may be formed in the magnet support layer 1212 and an individual permanent magnet segment 1214*a-d* inserted in each of the holes, for example using self-assembly techniques, and fixing permanent magnet segments 1214*a-d* to magnet support layer 1212 by a glue or a polymer (for example), to thereby form the movable mass 1206 having the structure of FIG. 12. In another way, permanent magnet segments 1214*a-d* may be created at the same time by filling the holes with magnetic material using for example a deposition process (or another suitable process) creating permanent magnet Through Silicon Vias (TSVs). Furthermore, in the illustrated embodiment each of the permanent magnet segments 1214*a-d* extends beyond the lower or bottom surface of the magnet support layer 1212 towards the EHS coils 1208*a-d*, for example it may be achieved by an etching process applied to the bottom surface of the silicon magnet support layer 1212. The segments 1214*a-d* may also be flush with the bottom surface of the magnet support layer 1212 or may extend beyond both the bottom and upper surfaces of the magnet support layer in other embodiments. Once again, the specific number of EHS coils 1208 and permanent magnet segments 1214 may vary in different embodiments.

FIGS. 13A-13F are cross-sectional views illustrating further embodiments of a moveable mass 1300 that may be utilized in the embodiment of FIG. 12 and other embodiments of the present disclosure. The embodiment of FIG. 13A, includes a magnet support layer 1302 that may be made from a semiconductor material such as silicon. Vias are then formed in the magnet support layer 1302 through known semiconductor processing techniques and then suitable permanent magnetic material is deposited, grown, or otherwise suitably formed in each of the vias to form individual permanent magnets 1304*a* and 1304*b*. In this embodiment the permanent magnets 1304 form the permanent magnet layer 114 of the embodiment of FIG. 1. The substrate 116 and structural layer 118 formed thereon are also illustrated in figure along with the EHS coil 108, which is formed by two individual coils each positioned adjacent one of the permanent magnets 1304 in the illustrated embodiment.

Figures 13A, 13B:
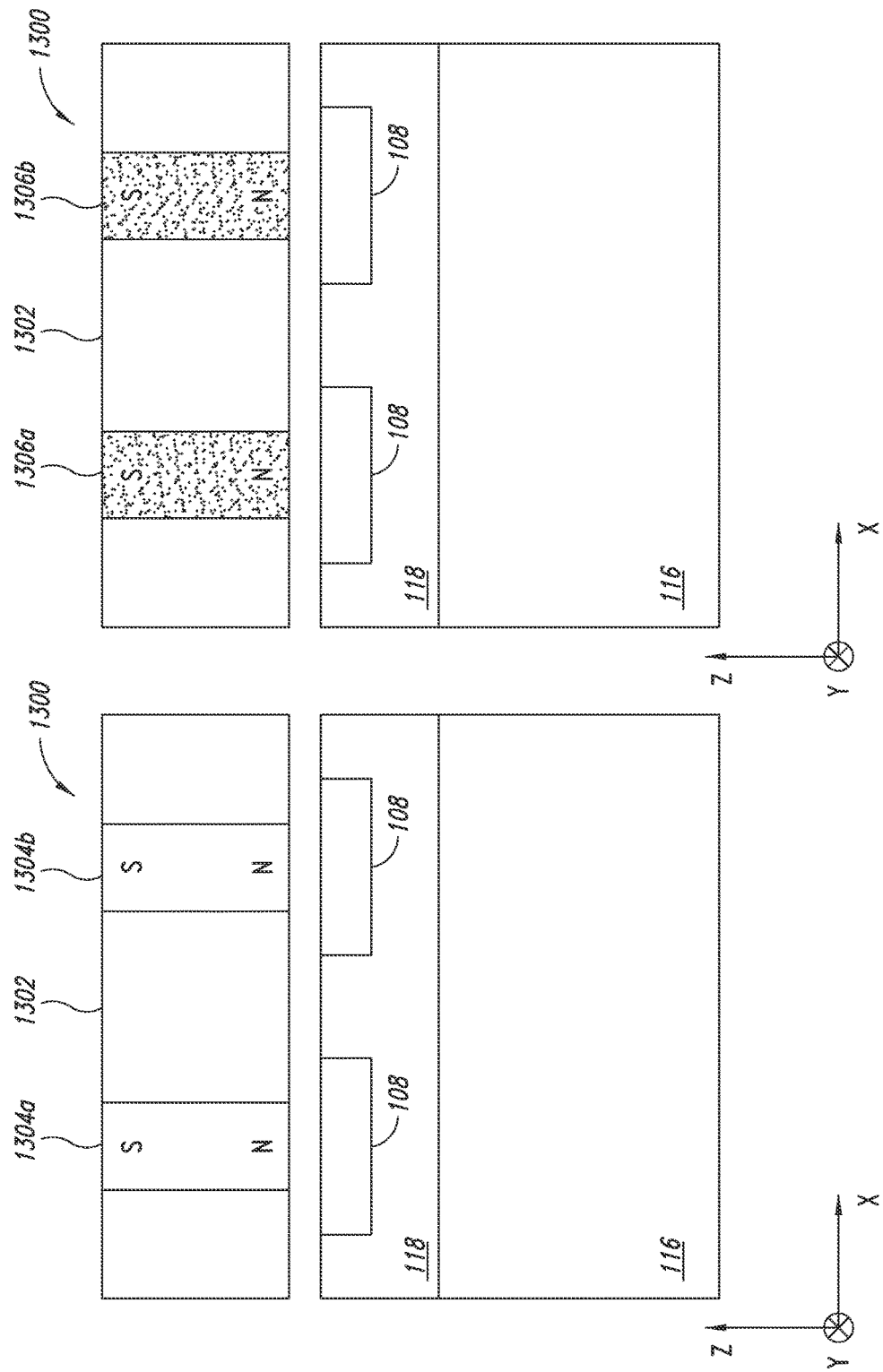
FIGS. 13A-13F are cross-sectional views illustrating further embodiments of a moveable mass that may be utilized in the embodiment of FIG. 12 and other embodiments of the present disclosure.
Figure 13C:
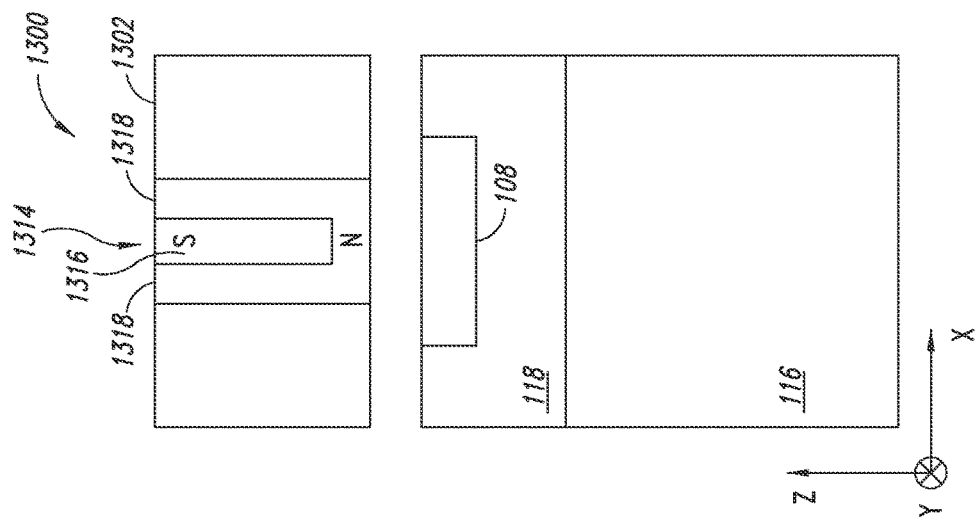

FIG. 13B illustrates an embodiment of the movable mass 1302 that is the same as that of FIG. 13A except permanent magnets 1306*a* and 1306*b* are formed from a host material with magnetic particles contained in the host material. The host material could be, for example, an epoxy resin or a polymer. FIG. 13C illustrates yet another embodiment of the movable mass 1300 where one or more via, one of which is shown in the figure, is formed in the magnet support layer 1302 and a permanent magnet 1308 having a cavity 1310 is formed in the via. In this embodiment, the permanent magnet 1308 includes a magnetic layer 1312 formed on the walls of the via. The layer 1312 could be formed through semiconductor processing techniques, such as where the via is cylindrical and the layer 1312 is formed on the cylindrical wall of the via. The poles N and S of the permanent magnet 1308 are shown. The permanent magnet 1308 is positioned adjacent the EHS coil 108 formed in the structural layer 118 on the substrate 116 of the chip 104 shown in the lower portion of the figure and previously discussed in detail with reference to FIG. 1.

Figure 13D:
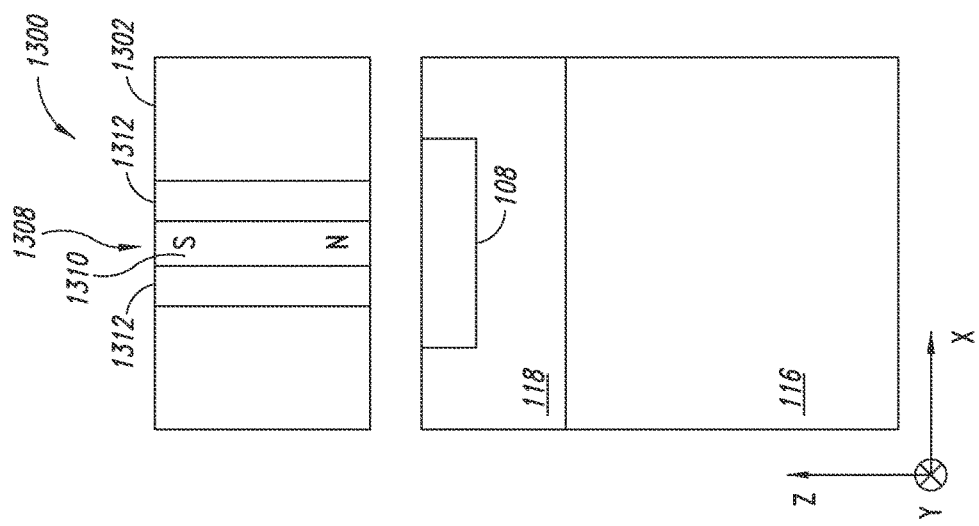

FIG. 13D illustrates yet another embodiment of the movable mass 1300 where one or more via, one of which is shown in the figure, is formed in the magnet support layer 1302 and a permanent magnet 1314 having a cavity 1316 similar to the structure of FIG. 13C is shown. The permanent magnet 1314 includes a magnetic layer 1318 formed on the walls of the via and, in contrast to embodiment of FIG. 13C, also extending along the lower portion of the via along lower surface of the magnet support layer 1302. The layer 1312 may also be formed through semiconductor processing techniques as discussed with reference to FIG. 13C and the poles N and S of the permanent magnet 1318 are as shown. The permanent magnet 1318 is positioned adjacent the EHS coil 108 formed in the structural layer 118 on the substrate 116 of the chip 104.

Figures 13E, 13F:
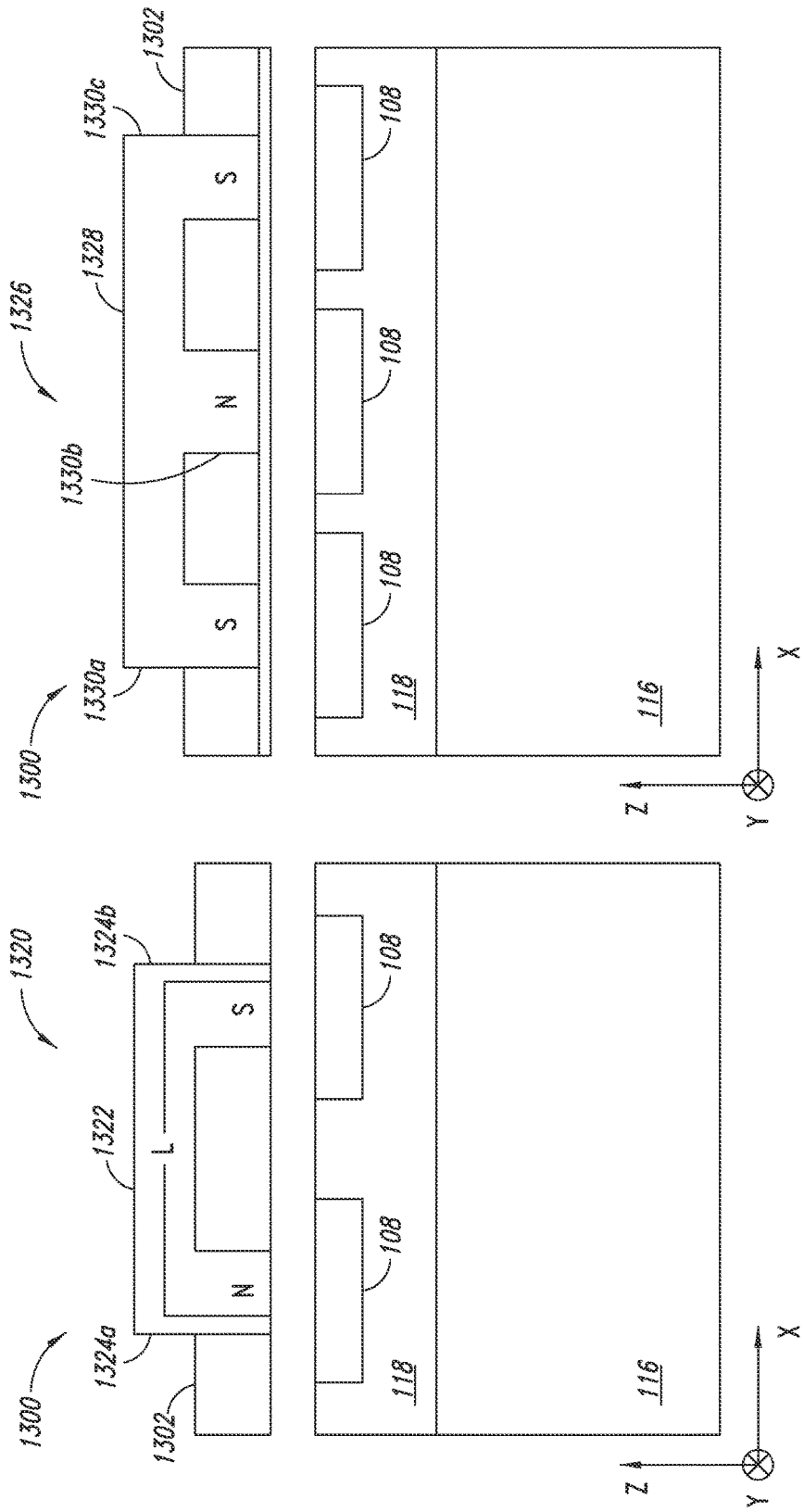

FIG. 13E illustrates yet another embodiment of the movable mass 1300 where a pair of vias are formed in the magnet support layer 1302. A permanent magnet 1320 has a horizontal portion 1322 extending on the upper surface of the magnet support layer 1302 and two vertical portions 1324*a* and 1324*b* extending respectively through the pair of vias.

This embodiment increases a length L of the permanent magnet 1320 where the length L corresponds to the distance from the north pole N to the south pole S of the permanent magnet as illustrated in the figure. Thus, the length L includes the lengths of the two vertical portions 1324a and 1324b along the Z axis as well as the length of the horizontal portion 1322 along the X axis. Increasing the length L of the permanent magnet 1320 increases the magnetic field B generated by the magnet. In general, keeping other factors the same increasing the length L will increase the magnitude of the magnetic field B generated by the permanent magnet 1320, as will be appreciated by those skilled in the art. The poles N and S of the permanent magnet 1320 are shown. Each of the vertical portions 1324a and 1324b of the permanent magnet 1320 is positioned adjacent a respective coil of the EHS coil 108 formed in the structural layer 118 on the substrate 116 of the chip 104, which are once again shown in the lower portion of the figure.

FIG. 13F illustrates yet another embodiment of the movable mass 1300 in which three vias are formed in the magnet support layer 1302. A permanent magnet 1326 has a horizontal portion 1328 extending on the upper surface of the magnet support layer 1302 and three vertical portions 1330a, 1330b, and 1330c extending respectively through the three of vias. This embodiment may also increase a length L of the permanent magnet 1320 to increase the magnetic field B generated by the magnet, as will be appreciated by those skilled in the art. The north pole N and two south poles S of the permanent magnet 1326 are shown (north pole N and south pole S may be exchanged in other embodiments). Furthermore, in the illustrated embodiment the lower surfaces of the vertical portions 1330a-c are not exposed on the lower surface of the magnet support layer 1302 in contrast to previous embodiments, such as the embodiments of FIGS. 13A-13E. Each of the vertical portions 1330a-c is positioned adjacent a respective coil of the EHS coil 108 formed in the structural layer 118 on the substrate 116 of the chip 104, which are once again shown in the lower portion of the figure.

Figure 14:
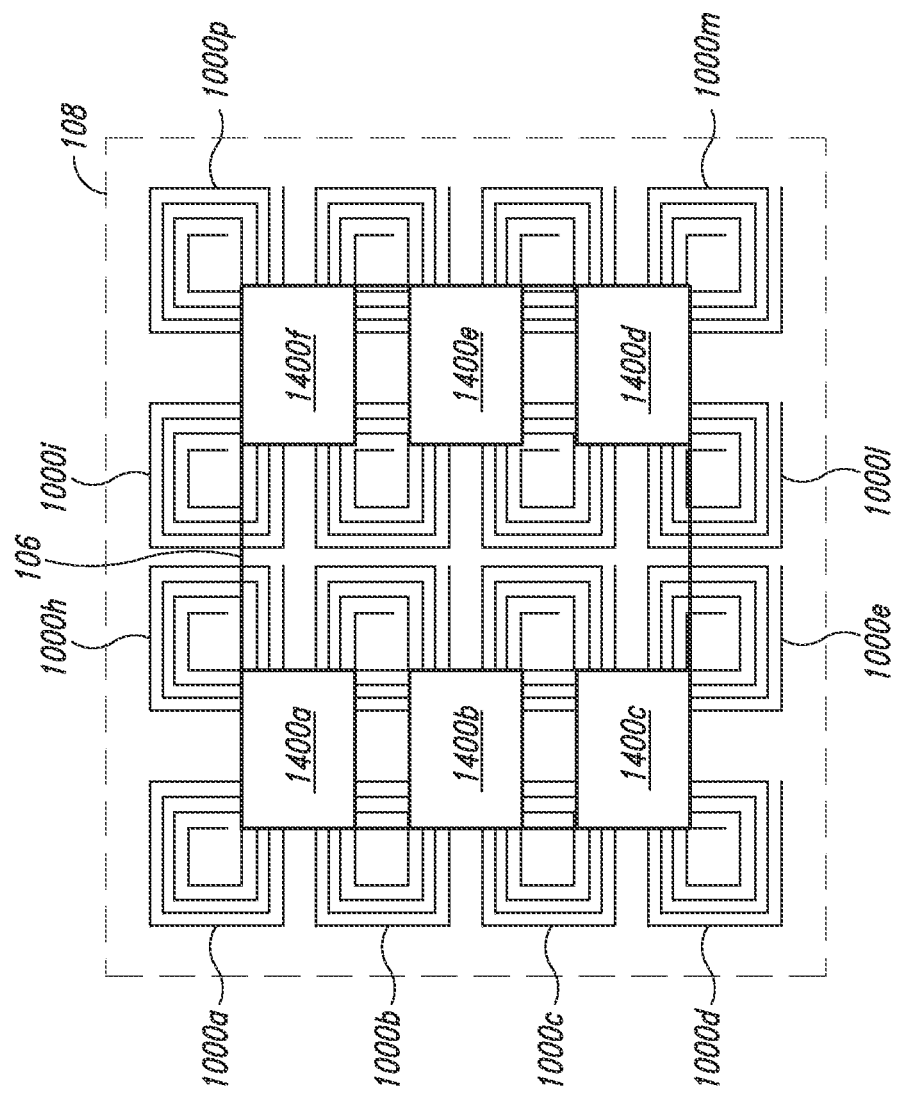
FIG. 14 is a top view showing the arrangement of permanent magnet layers on the moveable mass relative to EHS coils in the embodiment of FIG. 10B according to another embodiment of the present disclosure.

FIG. 14 is a top view showing an arrangement of permanent magnets 1400a-1400f positioned on the moveable mass 106 relative to the EHS coils 1000a-1000p in the EHS coil 108 of the embodiment of FIGS. 10A and 10B according to another embodiment of the present disclosure. Only some of the EHS coils 1000a-p are labeled in FIG. 14 to simplify the figure. FIG. 14 illustrates the movable mass 106 at rest or in its home position, meaning the mass is not moving or is at rest even in the presence of ambient external forces in this position. In this position each of the permanent magnets 1400a-f is not positioned directly adjacent or over a corresponding one of the EHS coils 1000a-p. There are only six permanent magnets 1400a-f while there are sixteen EHS coils 1000a-p. Each of the permanent magnet 1400a-f is positioned in the center of four corresponding EHS coils 1000a-p. This arrangement of the permanent magnets 1400a-f relative to the EHS coils 1000a-f may help increase changes in the flux of the magnetic field B generated by the permanent magnets 1400a-f through the EHS coils 1000a-p responsive to movements of the movable mass 106.

Figure 15:
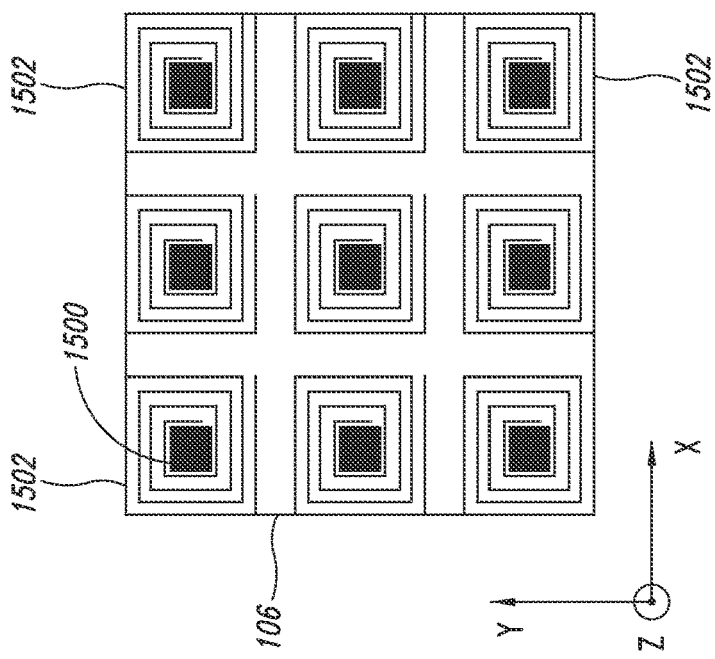
FIG. 15 illustrates an arrangement of vertically-oriented permanent magnetics of the movable mass in relation to EHS coils according to another embodiment of present disclosure.

FIG. 15 is a top view showing an arrangement of permanent magnets 1500 positioned on the moveable mass 106 relative to EHS coils 1502 that form the EHS coil 108 of FIG. 1. Only some of the permanent magnets 1500 and EHS coils 1502 are labeled in FIG. 15 to simplify the figure. FIG. 14 again illustrates the movable mass 106 at rest or in its home position. Each of the permanent magnets 1500 is a vertically-oriented magnet in this embodiment, such as the permanent magnet segments 1214a-d of FIG. 12 or the vertically-oriented magnets in the embodiments of FIGS. 13A-13D. There are nine magnets 1500 and nine EHS coils 1502 in the embodiment of FIG. 15, each magnet being aligned in the XY plane over a center of a corresponding one of the EHS coils 1502.

Figure 16:
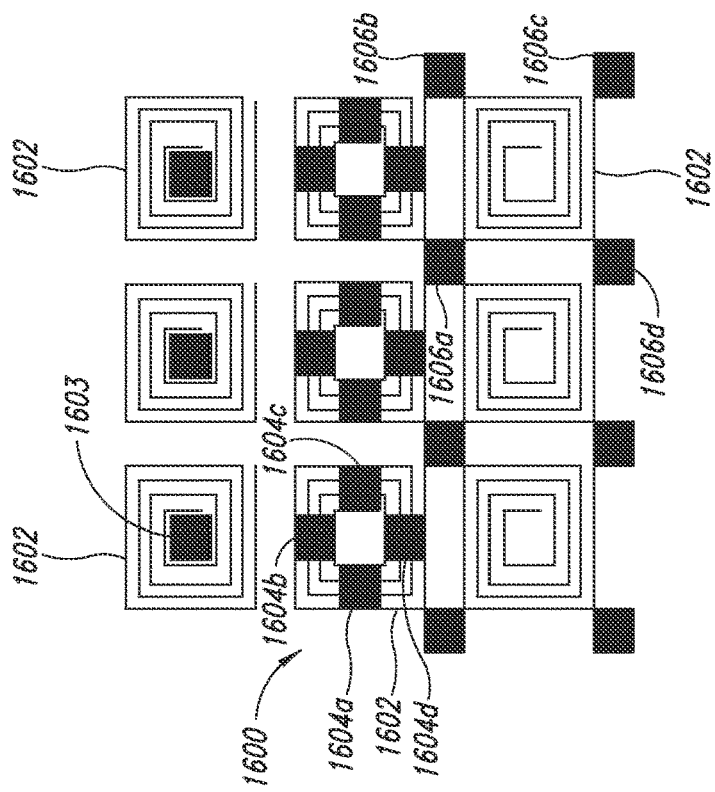
FIG. 16 illustrates yet another arrangement of vertically-oriented permanent magnetics of the movable mass in relation to EHS coils such that the coils generate signals having different phases according to yet another embodiment of present disclosure.

FIG. 16 illustrates yet another arrangement of vertically-oriented permanent magnetics 1600 of the movable mass 106 that have an arrangement in relation to EHS coils 1602 of the EHS coil 108 (FIG. 1) such that the EHS coils 1602 generate signals having different phases according to yet another embodiment of present disclosure. Once again, only some of the permanent magnets 1600 and EHS coils 1502 are labeled in FIG. 15 to simplify the figure. For the first row of EHS coils 1602, a single vertically-oriented permanent magnet 1600 is aligned in the XY plane over a center of a corresponding one of the EHS coils 1602 in the first row. In the second row of EHS coils 1602, each permanent magnet 1600 includes four magnetic segments 1604a-d, which are labeled only for the leftmost permanent magnet 1600 in the second row of EHS coils 1602. The four magnetic segments 1604a-d of each permanent magnet 1600 are arranged in a cross or T-shape over a corresponding EHS coil 1602 in the second row. Finally, in the third row of EHS coils 1602, each permanent magnet 1600 includes four magnetic segments 1606a-d, which this time are labeled only for the rightmost permanent magnet 1600 in the third row of EHS coils 1602. The four magnetic segments 1606a-d of each permanent magnet 1600 are arranged at respective corners of the corresponding EHS coil 1602 in the third.

In operation, due to the different arrangements of the permanent magnets 1604 in the first, second and third rows of the EHS coils 1602, the signals generated by the EHS coils in each of the rows will have a different phase relative to the signals generated by the EHS coils in the other rows. This embodiment may be considered analogous to a three-phase electrical power system with each of the three rows of EHS coils 1602 generating signals having a different phase than the other two rows of EHS coils responsive to movement of the movable mass 106 and thereby the permanent magnets 1602 on the movable mass.

Figure 17:
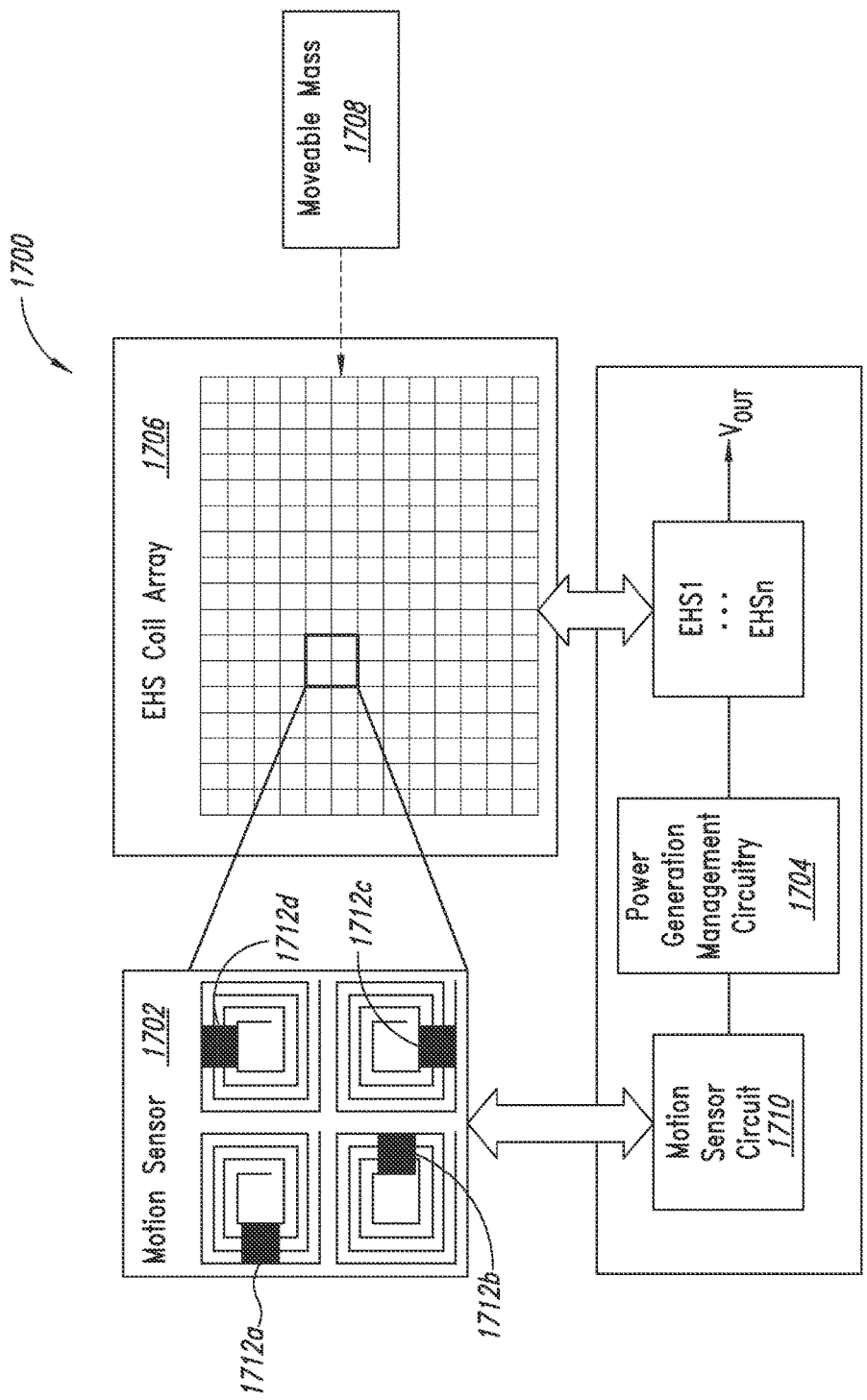
FIG. 17 is a functional diagram of an intelligent magnetic EHS device including a motion sensor and intelligent power generation management circuitry according to another embodiment of the present disclosure.

FIG. 17 is a functional diagram of an intelligent magnetic EHS device 1700 including a motion sensor 1702 and power generation management circuitry 1704 according to another embodiment of the present disclosure. The intelligent EHS device 1700 includes an EHS coil array 1706 which is represented in the figure through an array of squares, each square representing an individual EHS coil in the array. For example, the individual EHS coils of the EHS coil array 1706 may correspond to the EHS coils 1000a-p in the embodiment of FIG. 10A. The embodiment of FIG. 10A contains a square array of the EHS coils 1000a-p. A movable mass 1708 includes a number of permanent magnets that are not expressly shown for the moveable mass in the figure, with each of these permanent magnets being magnetically coupled to the EHS coil array 1706. The moveable mass 1708 could, for example, correspond to the moveable mass 1206 in the embodiment of FIG. 12 that includes a plurality of the permanent magnet segments 1214, four of which 1214a-d are shown in FIG. 12.

In operation, a motion sensor circuit 1710 senses signals generated by the motion sensor 1702 to detect the direction of movement of the moveable mass 1708. The motion sensor circuit 1700 provides the detected direction of movement of the movable mass 1708 to the power generation management circuitry 1704. Utilizing the detected direction of movement of the movable mass 1708, the power generation management circuitry 1704 then controls a plurality of EHS circuits EHS1-EHSN to capture electrical energy from selected EHS coils or groups of EHS coils in the coil array 1706. In this way, the intelligent magnetic EHS device 1700 may optimize or improve the power generation of the device by harvesting or scavenging energy from EHS coils that will store the most magnetic energy due to the direction of movement of the movable mass 1708. The power generation management circuitry 1704 may in this way decide the best combination or coupling of the outputs from selected EHS coils and inputs-outputs of selected EHS circuits EHS1-EHSN that will maximize the generated electrical energy in agreement with the direction of movement of the movable mass 1708 and the permanent magnets contained thereon relative to the EHS coil array 1706.

In the embodiment of FIG. 17, the motion sensor 1702 is formed by a group of EHS coils in the coil array 1706 in combination with a corresponding permanent magnet or magnets on the movable mass 1708. The permanent magnets of the movable mass 1708 that are utilized to form the motion sensor 1702 are labeled 1712 in the figure. Thus, in this embodiment the motion sensor 1702 is formed by four EHS coils in the coil array 1706 and four permanent magnets 1712*a-d* on the movable mass 1708. Thus, these four EHS coils of the coil array 1706 are not utilized in capturing electrical energy but instead are used to form the motion sensor 1702. Other embodiments of the motion sensor 1702 are of course possible, for example increasing the number of permanent magnets 1712 and EHS coils. In another embodiment, not shown, the four permanent magnets 1712*a-d* and the respective EHS coils can be placed in the corners of EHS coil array 1706 to increase sensitivity of motion sensor 1702.

Figure 18:
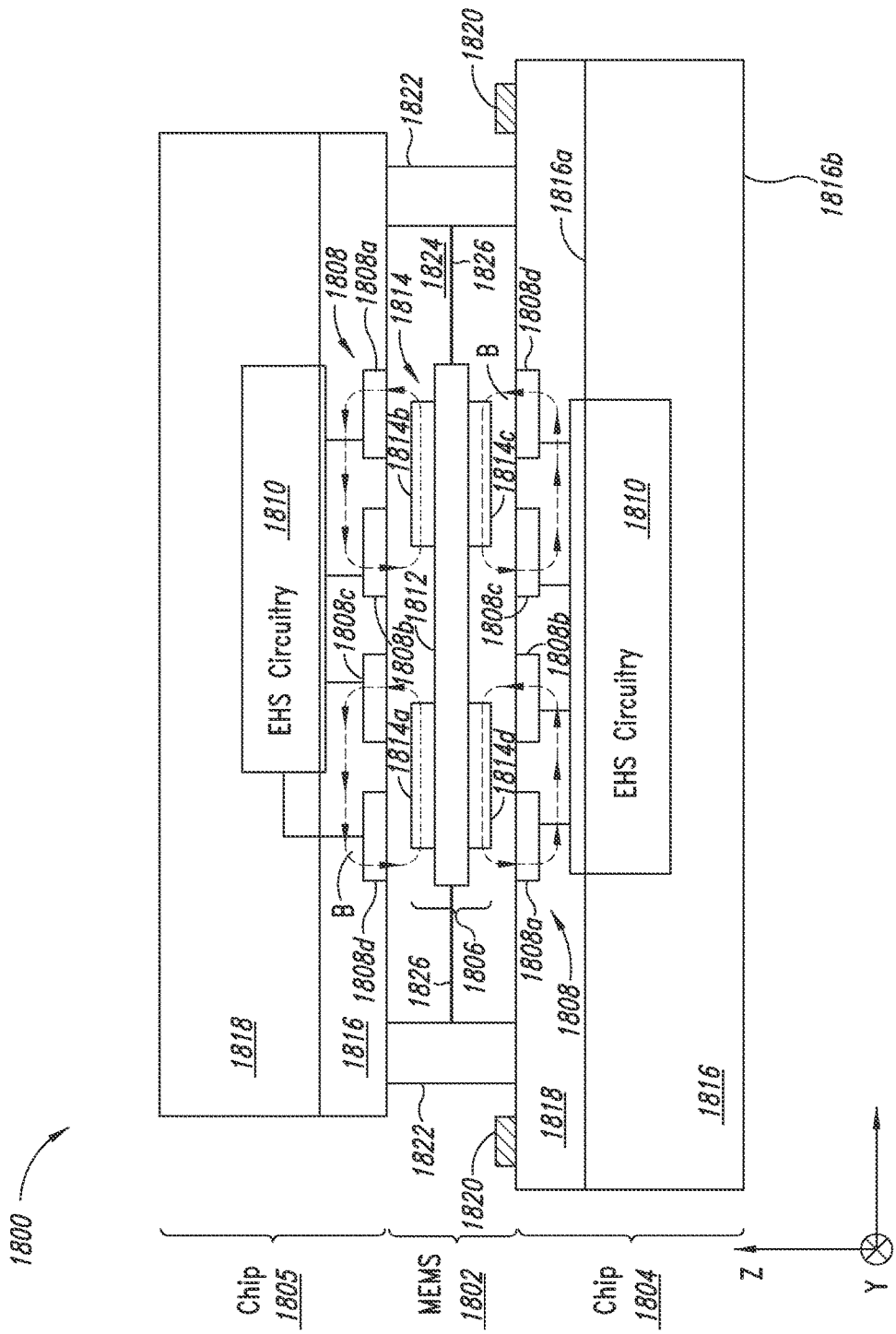
FIG. 18 is a cross-sectional diagram of a magnetic EHS device including a magnetic MEMS device positioned between first and second semiconductor chips according to another embodiment of the present disclosure.

FIG. 18 is a cross-sectional diagram of a magnetic EHS device 1800 including a magnetic MEMS device 1802 positioned between a first semiconductor chip 1804 and a second semiconductor chip 1805 according to another embodiment of the present disclosure. The components 1802-1826 of the magnetic EHS device 1800 correspond respectively to the components 102-126 in the magnetic EHS device 100 of FIG. 1. This is true except for the second semiconductor chip 1805, which is not present in the embodiment of FIG. 1. Moreover, the structure of some of the components 1802-1826 may be different than that of the corresponding component 102-126, as will now be described in more detail.

In the embodiment of FIG. 18, the second semiconductor chip 1805 includes the same components as the first semiconductor chip 1804 for the purposes of the description of this embodiment. The second semiconductor chip 1805 would typically, however, include additional circuitry (not shown) that is different than additional circuitry (also not shown) of the first semiconductor chip 1804. In other words, the additional circuitry of the first semiconductor chip 1804 that receives electrical power from the MEMS device 1802, EHS coils 1808 and EHS circuitry 1810 would typically be different than the additional circuitry of the second semiconductor chip 1805 that receives electrical power from the same components.

The EHS coil 1808 includes a number of individual EHS coils 1808*a-d*. Similarly, the permanent magnet layer 1814 includes a number of individual permanent magnet segments 1814*a-d* positioned on both the upper and lower surfaces of the magnet support layer 1812. Each of the magnet segments 1814*a-d* is positioned vertically adjacent two of the EHS coils 1808*a-d* in either the first semiconductor chip 1804 or second semiconductor chip 1805. For example, the magnet segment 1814*a* is positioned near EHS coils 1808*c* and 1808*d* of the second semiconductor chip 1805 while the magnet segment 1814*c* is positioned near EHS coils 1808*c* and 1808*d* of the first semiconductor chip 1804.

The permanent magnet segments 1814*a-d* are horizontally-oriented permanent magnets in the embodiment of FIG. 18, meaning that the poles of the segments are horizontally oriented in the XY plane. This is indicated through the dotted lines representing the magnetic field B generated by each of the permanent magnet segments 1814*a-d*. In this embodiment, the EHS coils 1808*a-d* may be spiral coils such as the coils 900 in the embodiment of FIG. 9A or each may be a coil similar to the EHS coil 108 of FIGS. 1, 2 and 4.

The permanent magnet segments 1814*a-d* are formed on both the upper and lower surfaces of the magnet support layer 1812 in the embodiment of FIG. 18. Thus, the permanent magnet segments 1814*a* and 1814*b* are formed on the upper surface of the magnet support layer 1812 and function to generate electrical power for the second semiconductor chip 1805. Conversely, the permanent magnet segments 1814*c* and 1814*d* are formed on the lower surface of the magnet support layer 1812 and function to generate electrical power for the first semiconductor chip 1804. Suitable methods, such as semiconductor processing methods involving deposition or sputtering may, for example, be utilized in forming the structure of the movable mass 1806 and magnet segments 1814*a-d*, as will be understood by those skilled in the art. In operation, movement of the movable mass 1806 results in the EHS circuitry 1810 of both the first and second semiconductor chips 1804, 1805 capturing electrical energy for use in powering the first and second semiconductor chips and/or an external system.

Figure 19:
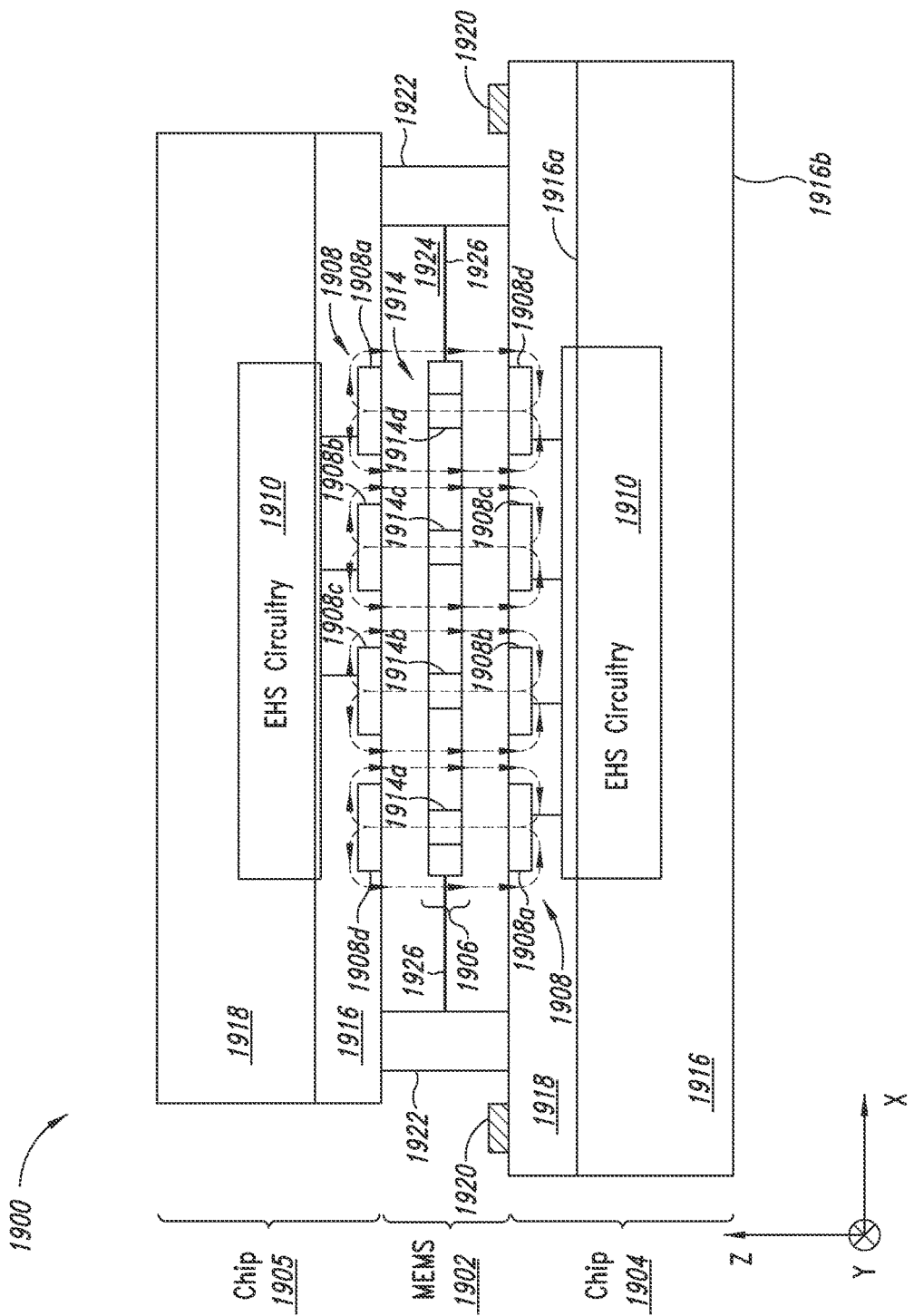
FIG. 19 is a cross-sectional and functional diagram of a magnetic EHS device including a magnetic MEMS device with vertically-oriented permanent magnetic layers on a moveable mass where the MEMS device is positioned between first and second semiconductor chips according to another embodiment of the present disclosure.

FIG. 19 is a cross-sectional diagram of a magnetic EHS device 1900 including a magnetic MEMS device 1902 positioned between a first semiconductor chip 1904 and a second semiconductor chip 1905 according to another embodiment of the present disclosure. The magnetic EHS device 1900 is the same as the magnetic EHS device 1800 of FIG. 18 except for the moveable mass 1906. The moveable mass 1906 includes a number of individual permanent magnet segments 1914*a-d* extending through the magnet support layer 1812. The magnet segments 1914*a-d* may be the same as any of the embodiments of FIGS. 13A-13D, for example. Each of the magnet segments 1914*a-d* is positioned vertically adjacent two of the EHS coils 1908*a-d*, one in the first semiconductor chip 1804 and one in the second semiconductor chip 1805. For example, the magnet segment 1914*a* is positioned adjacent the EHS coil 1908*a* in the first semiconductor chip 1904 and the EHS coil 1908*d* in the second semiconductor chip 1905.

The permanent magnet segments 1914*a-d* are vertically-oriented permanent magnets in the embodiment of FIG. 19, meaning that the poles of the segments are vertically oriented in an axis parallel to the Z axis. This is indicated through the dotted lines representing the magnetic field B generated by each of the permanent magnet segments 1914*a-d* extending primarily parallel to the Z axis in the figure. In this embodiment, the EHS coils 1908*a-d* may be spiral coils such as the coils 900 in the embodiment of FIG. 9A or any other suitable coil structure. In operation, movement of the movable mass 1906 along any one or more of the three X, Y and Z axes results in the EHS circuitry 1910 of both the first and second semiconductor chips 1904, 1905 capturing electrical energy for use in powering the first and second semiconductor chips and/or an external system.

FIG. 20 illustrates one embodiment of the magnetic EHS device of FIG. 18 or 19 in which the first semiconductor chip 1804/1904 and second semiconductor chip 1805/1905 are rotated relative to one another to simplify electrical connections to these chips, as will now be explained in more detail. The embodiment of FIG. 20 will be described as with reference to the embodiment of FIG. 18 in the following description, but may be applied to the embodiment of FIG. 19 as just mentioned as well as to other embodiments where multiple semiconductor chips are stacked on top of one another with a magnetic MEMS device positioned between.

In the embodiment of FIG. 20, the first semiconductor chip 1804 is rotated ninety degrees relative to the second semiconductor chip 1805. Thus, if each of the first and second semiconductor chips 1804 and 1805 is considered to have a longitudinal axis LA along its longer edges or sides as shown in the figure, then these longitudinal axes LA of chips 1804 and 1805 are rotated 90 degrees relative to one another. The first semiconductor chip 1804 has its longitudinal axis LA parallel to the X axis while the second semiconductor chip 1805 has its longitudinal axis LA parallel to the Y axis. In this way, the bonding pads 1820 of the chip 1804 are exposed from the top as seen in the top view of FIG. 20. If chips 1804 and 1805 of the same or similar sizes and chip 1805 is not rotated 90 degrees relative to chip 1804, then chip 1805 may cover the bonding pads 1820 of chip 1804, making the formation of electrical connections to these bonding pads more difficult, as will be discussed in more detail below with reference to FIGS. 21A-21C.

Figure 21A:
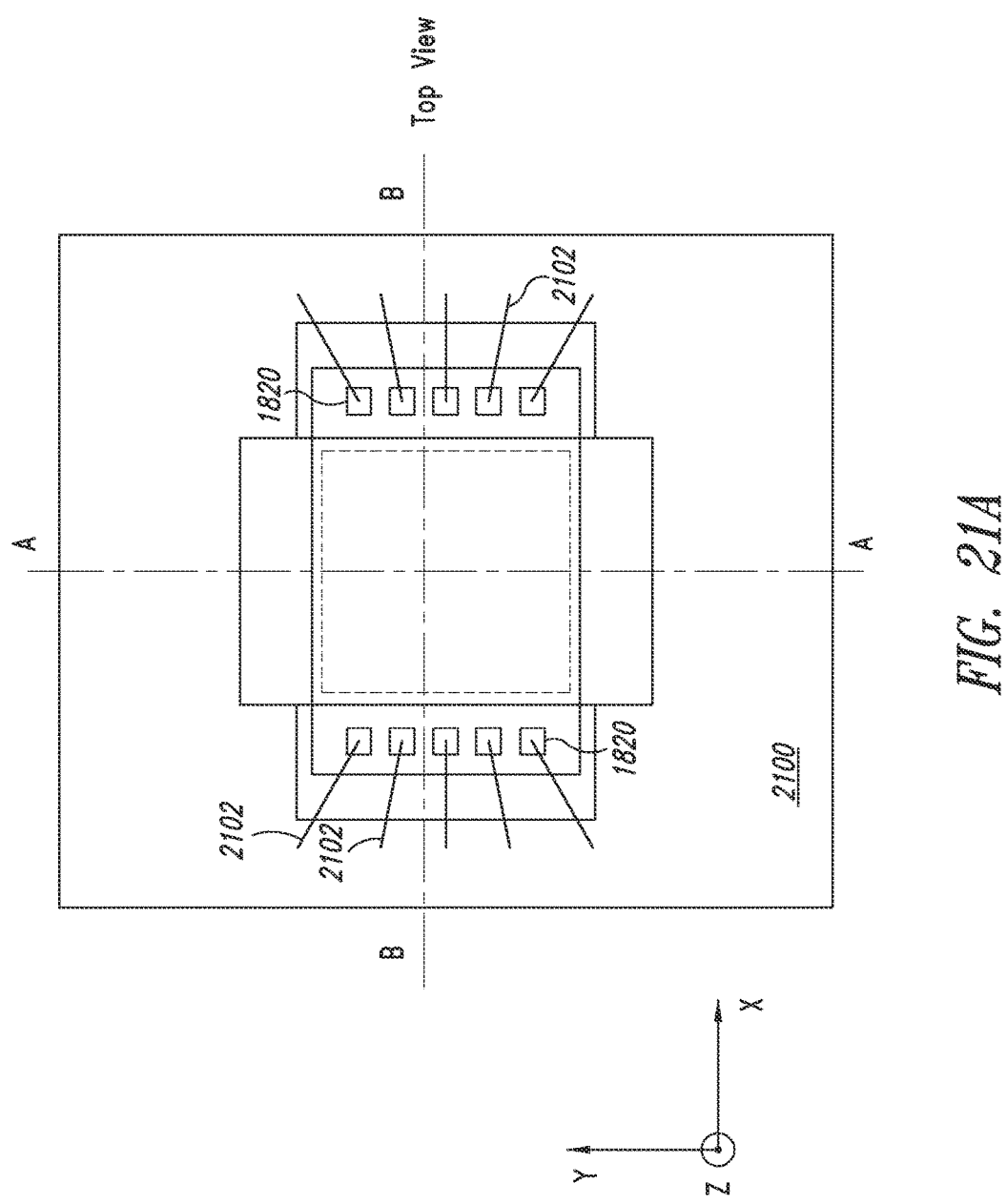
FIGS. 21A is a top view of the magnetic EHS device of FIG. 20 mounted in a package substrate according to one embodiment of the present disclosure.

FIGS. 21A is a top view of the magnetic EHS device 1800 of FIG. 20 mounted in a package substrate 2100 according to one embodiment of the present disclosure. The package substrate 2100 may be a printed circuit board, a package including eventually a lead frame, or other suitable package to which the magnetic EHS device 1800 is mounted and electrically interconnected. Section line BB extends along the longitudinal axis LA of the chip 1804 of FIG. 20 and section line AA extends along the longitudinal axis LA of the chip 1805. The figures show the electrical interconnection of the bonding pads 1820 of the chip 1804 to the package substrate 2100 through bonding wires 2102. Only some of the bonding wires 2102 and pads 1820 are labeled in FIG. 21A to simplify the figure. Although not expressly shown in the figure, the bonding wires 2102 would typically be mounted to bonding pads on the package substrate 2100. This figure illustrates the advantage of having the bonding pads 1820 of the chip 1804 exposed from the top that is achieved by rotating the chips relative to one another discussed with reference to FIG. 20.

FIG. 21B is a cross-sectional view of the magnetic EHS device 1800 and package substrate 2100 along the sectional line BB or "BB-axis" in FIG. 21A. This view illustrates the connection of the bonding wires 2102 between the bonding pads 1820 on the chip 1804 and the package substrate 2100. The exposure of the bonding pads 1820 resulting from the rotation of the chip 1805 relative to chip 1804 as discussed with reference to FIG. 20 eases the connection of bonding wires 2102 to the bonding pads 1820. Note that in FIG. 21B for each of the chips 1804 and 1805 the substrate 1816 and structural layer 1818 (see FIG. 18) of each chip are shown but only the chip as a whole is labeled 1804, 1805 to simplify the figure.

FIG. 21C is a cross-sectional view of the magnetic EHS device 1800 and package substrate 2100 along the sectional line AA or "AA-axis" in FIG. 21A. This view illustrates the interconnection of the chip 1805 and the package substrate 2100 through solder balls/bumps 2104 in the illustrated embodiment. Once again, the rotation of the chip 1805 relative to chip 1804 as discussed with reference to FIG. 20 results in bonding pads (not shown) on the chip 1805 being exposed over the surface of the package substrate 2100. This allows solder balls 2104, or other suitable interconnections, to be utilized to interconnect the bonding pads on the chip 1805 with bonding pads (not shown) on the package substrate 2100. Thus, the rotation of the chip 1804 relative to the chip 1805 simplifies the electrical interconnection of both chips to the package substrate 2100.

Figure 22:
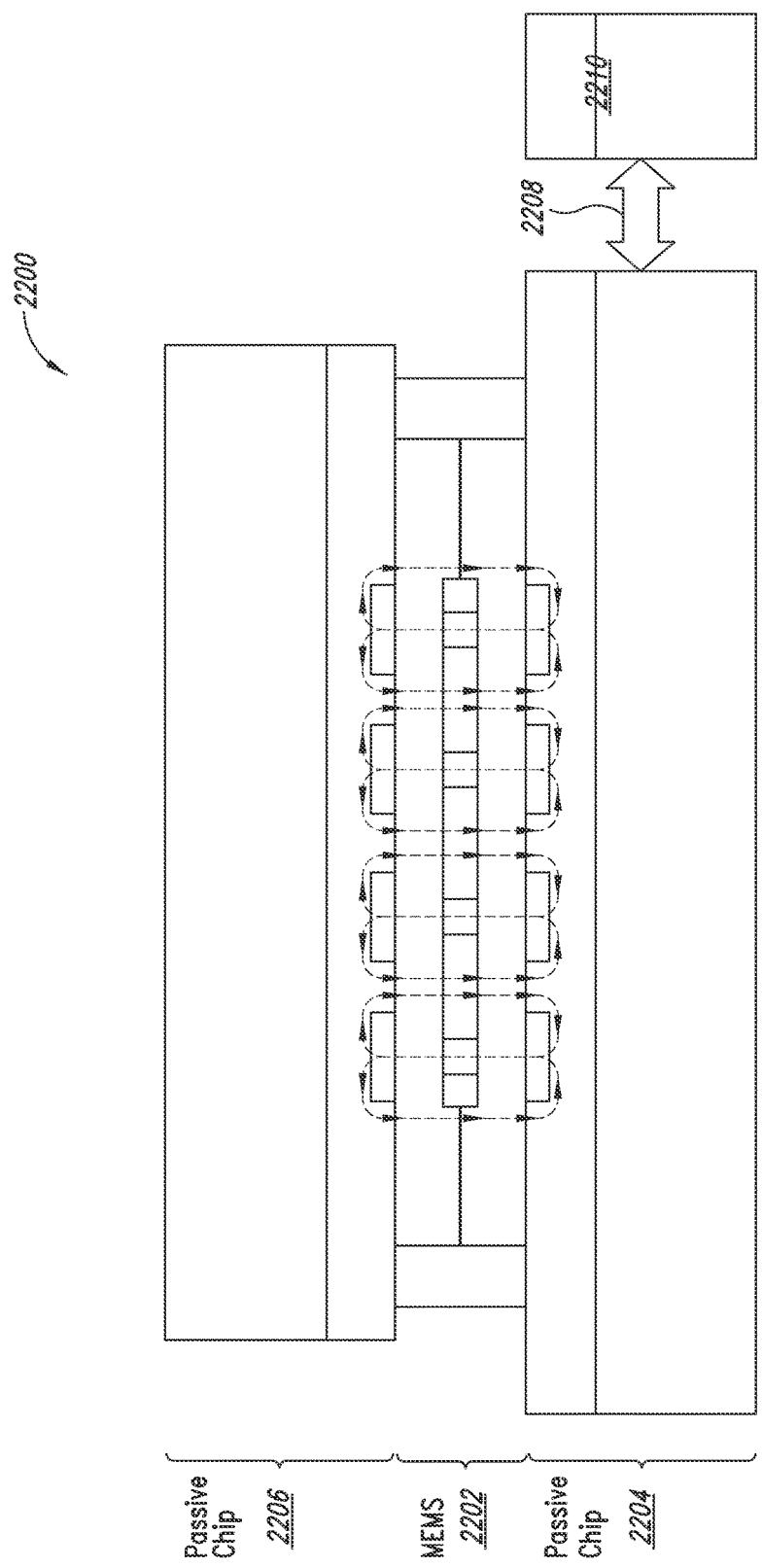
FIG. 22 is a cross-sectional and functional diagram of a magnetic EHS device including a magnetic MEMS device positioned between first and second passive chips that are then coupled to a semiconductor chip according to yet another embodiment of the present disclosure.

FIG. 22 is a cross-sectional and functional diagram of a magnetic EHS device 2200 including a magnetic MEMS device 2202 positioned between first and second passive chips 2204 and 2206 according to yet another embodiment of the present disclosure. The magnetic EHS device 2200 is then coupled through a suitable interconnection 2208 to a semiconductor chip 2210. The structure of the magnetic MEMS device 2202 is the same as that of the MEMS device 1902 of FIG. 19 but components of the MEMS device 2202 have not been individually labelled in order to simplify FIG. 22. The MEMS device 2202 may of course have other embodiments, such as the embodiments previously described in FIGS. 1-18.

The magnetic EHS device 2200 enables the chip 2210 to be a standard chip, with the interconnection 2208 electrically coupling this standard chip to the magnetic EHS device 2200 for energy harvesting and scavenging. Each of the passive chips 2204 and 2206 includes at least EHS coils for magnetic coupling to the permanent magnets on the moveable mass of the MEMS device 2202. In the case where the passive chips 2204 and 2206 include only EHS coils, these passive chips 2204 and 2206 may be created using also a dielectric substrate like a glass or ceramic substrate on which EHS coils may be created. Thus, in one embodiment the interconnection 2208 couples the EHS coils of the passive chips 2204 and 2206 to the chip 2210, and the chip 2210 includes EHS circuitry for processing signals from these EHS coils to capture electrical energy. The passive chips 2204 and 2206 may also include EHS circuitry (see FIG. 19) in addition to the EHS coils, and in this situation the interconnection 2208 would correspond to a DC bus providing electrical energy captured by the magnetic MEMS device 2200 to power the chip 2210. The magnetic MEMS device 2200 may thus be more easily to interconnect with the standard chip 2210 or my reduce the amount of additional circuitry for energy harvesting and scavenging that must be included in the standard chip 2210.

Figure 23:
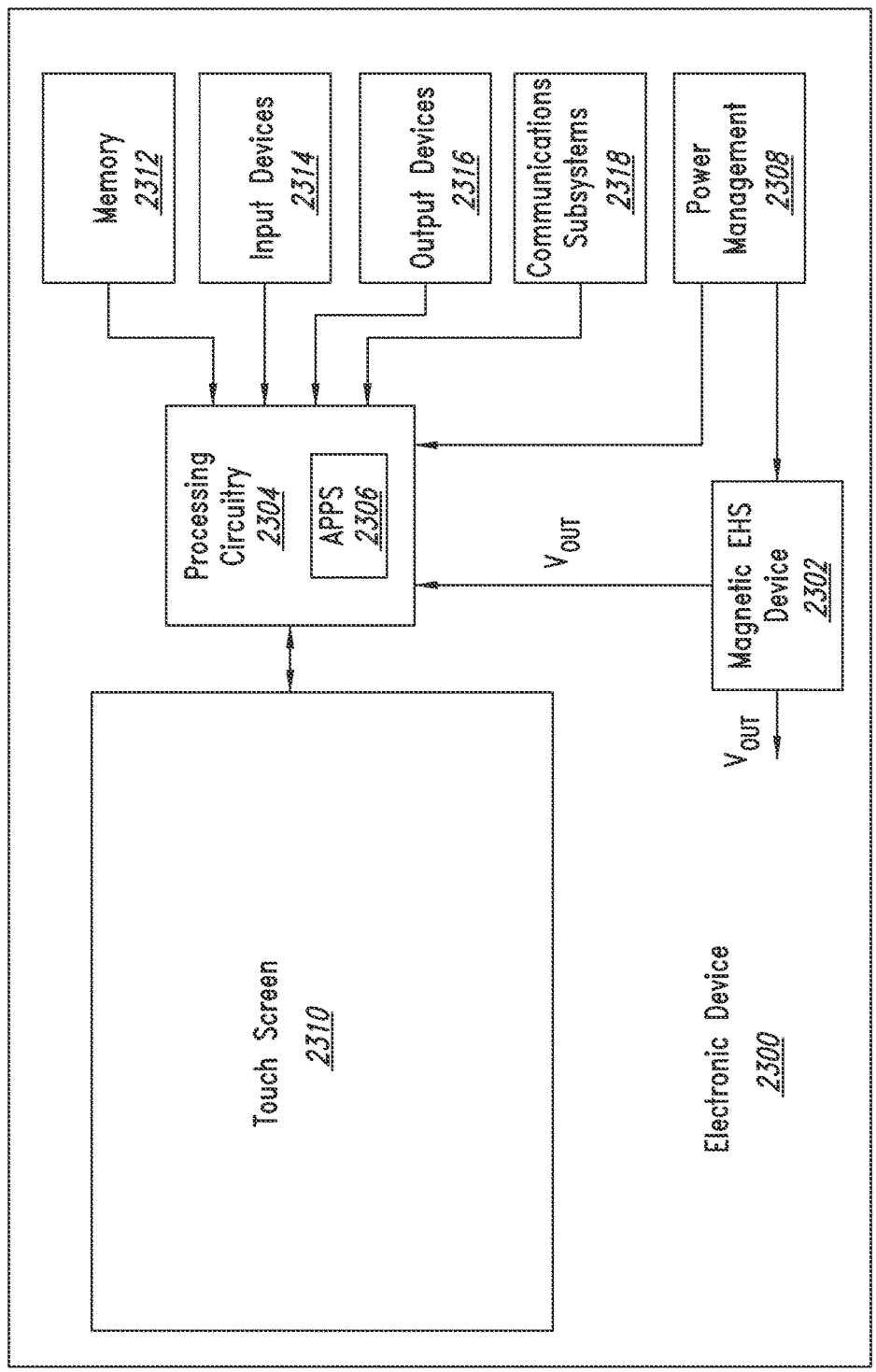
FIG. 23 is a functional block diagram of an electronic device including a magnetic EHS device according to any of the embodiments of FIGS. 1-22.

FIG. 23 is a functional block diagram of an electronic device 2300 including a magnetic EHS device 2302 according to any of the embodiments of FIGS. 1-22. The electronic device 2300 in the example embodiment of FIG. 23 includes processing circuitry 2304 that controls the overall operation of the electronic device 2300 and also executes applications or "apps" 2306 that provide specific functionality for a user of the electronic device 2300. In operation, the magnetic EHS device 2302 generates electrical energy in response to movement of the electronic device 2300. The magnetic EHS device 2302 supplies this electrical energy, represented in the figure as an output voltage Vout from the magnetic EHS device 2302, to power the processing circuitry 2304 and other components in the electronic device 2300. The electronic device 2300 may be any type of electronic device, such as a smart phone, wearable electronic device like a heart rate or activity monitor, and so on. Depending on the type of electronic device 2300, the magnetic EHS device 2302 may generate enough electrical energy to power the electronic device or only enough to drive some of the electronic circuitry in the device, or to charge a battery of the electronic device.

A power management subsystem 2308 of the electronic device is coupled to the processing circuitry 2304 and would may include a battery for powering the electronic device 100 and also control circuitry for controlling power-related operating modes of the device such as charging of the battery, power-savings modes, and so on. As mentioned above, the electrical energy generated by the magnetic EHS device 2302 may be used to charge such a battery contained in the power management subsystem 2308. The power management subsystem 2308 may also control operation of the magnetic EHS device 2302, such as by activating and deactivating the EHS circuitry (not shown) contained in the magnetic EHS device. Although shown separately in FIG. 23, the magnetic EHS device 2302 may be considered part of the power management subsystem 2308.

The electronic device 2300 further includes a video component such as a touch screen 2310 with a touch display (not shown) such as a liquid crystal display (LCD) and a touch panel (not shown) attached to or formed as an integral part of the touch display. In operation, the touch screen 2310 senses touches of a user of the electronic device 2300 and provides sensed touch information to the processing circuitry 2304 to thereby allow the user to interface with and control the operation of the electronic device. The processing circuitry 2304 also controls the touch screen 2310 to display desired visual content on the touch display portion of the touch screen. The action to touch the screen is also a mechanical stimulation for the magnetic EHS device 2302.

The electronic device 2300 further includes data storage or memory 2312 coupled to the processing circuitry 2304 for storing and retrieving data including the apps 2306 and other software executing on the processing circuitry and utilized by the electronic device 2300 during operation. Examples of typical types of memory 2312 include solid state memory such as DRAM, SRAM and FLASH, solid state drives (SSDs), and may include any other type of memory suited to the desired functionality of the electronic device 100 including digital video disks (DVDs), compact disk read-only (CD-ROMs), compact disk read-write (CD-RW) memories, magnetic tape, hard and floppy magnetic disks, tape cassettes, and so on.

Input devices 2314 are coupled to the processing circuitry 2304 and may include a keypad, whether implemented through the touch screen 2310 or separately, a pressure sensor, accelerometer, microphone, keyboard, mouse, digital camera to capture still and video images, and other suitable input devices. Output devices 2316 are coupled to the processing circuitry 2304 and may include, for example, audio output devices such as a speaker, printer, vibration device, and so on. The input devices 2314 and output devices 2316 collectively may include other types of typical communications ports for the electronic device 2300, such as USB ports, HDMI ports, and so on. The electronic device 2300 further includes communications subsystems 2318 coupled to the processing circuitry 2304 and which may include Wi-Fi, GPS, cellular and Bluetooth subsystems for providing the device with the corresponding functionality. The specific type and number of input devices 2314, output devices 2316, communications subsystems 2318, and even the specific functionality of the power management subsystem 2308 will of course depend on the type of the electronic device 2300, which may be any suitable type of electronic device or system to which the magnetic EHS device 2302 may generate sufficient electrical power to improve the operation of the electronic device or system.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A magnetic energy harvesting and scavenging circuit, comprising:
   a first substrate having a first surface and a second surface;
   at least one energy harvesting and scavenging coil formed proximate the first surface;
   an electromechanical systems device including a moveable mass extending over the first surface of the first substrate and configured to be displaced relative to the first substrate in three dimensions responsive to an external force applied to the moveable mass, and the movable mass including at least one permanent magnet that is magnetically coupled to the at least one energy harvesting and scavenging coil; and
   energy harvesting and scavenging circuitry electrically coupled to the at least one energy harvesting and scavenging coil, the energy harvesting and scavenging circuitry configured to generate electrical energy due to magnetic flux variation through the at least one energy harvesting and scavenging coil responsive to movement of the moveable mass.

2. The magnetic energy harvesting and scavenging circuit of claim 1, wherein the energy harvesting and scavenging circuitry is formed in the first substrate.

3. The magnetic energy harvesting and scavenging circuit of claim 1, wherein the energy harvesting and scavenging circuitry is formed external to the first substrate and is electrically coupled to the first substrate.

4. The magnetic energy harvesting and scavenging circuit of claim 1 further comprising a first semiconductor chip including the first substrate.

5. The magnetic energy harvesting and scavenging circuit of claim 4, wherein the first semiconductor chip comprises a structural layer formed on the first substrate and wherein the at least one energy harvesting and scavenging coil is formed in the structural layer.

6. The magnetic energy harvesting and scavenging circuit of claim 1, wherein the electrical energy generated by the energy harvesting and scavenging circuitry is generated responsive to an electrical quantity induced in the at least one energy harvesting and scavenging coil responsive to the magnetic flux variation.

7. The magnetic energy harvesting and scavenging circuit of claim 6, wherein the electrical quantity is a voltage or a current.

8. A magnetic energy harvesting and scavenging circuit, comprising:
   a first substrate having a first surface and a second surface;
   at least one energy harvesting and scavenging coil formed proximate the first surface;

an electromechanical systems device including a moveable mass extending over the first surface of the first substrate and configured to be displaced relative to the first substrate in three dimensions responsive to an external force applied to the moveable mass, and the movable mass including a magnet support layer and a permanent magnet layer attached to the magnet support layer; and energy harvesting and scavenging circuitry electrically coupled to the at least one energy harvesting and scavenging coil, the energy harvesting and scavenging circuitry configured to generate electrical energy due to magnetic flux variation through the at least one energy harvesting and scavenging coil.

9. The magnetic energy harvesting and scavenging circuit of claim 8, wherein the magnet support layer comprises a plate having an upper surface and a lower surface facing the first surface of the first semiconductor chip, and wherein the permanent magnet layer is attached to the lower surface of the magnet support layer.

10. The magnetic energy harvesting and scavenging circuit of claim 1, wherein the electromechanical systems device comprises a microelectromechanical systems (MEMS) device.

11. The magnetic energy harvesting and scavenging circuit of claim 10 wherein the MEMS device further comprises a packaging structure coupled to the first surface of the first semiconductor chip and defining an internal cavity that houses the moveable mass, the MEMS device further including a supporting structure coupled between the packaging structure and the moveable mass to moveably suspend the moveable mass within the internal cavity.

12. The magnetic energy harvesting and scavenging circuit of claim 11 wherein the supporting structure comprises a plurality of arms, each arm coupled between the packaging structure and the moveable mass.

13. The magnetic energy harvesting and scavenging circuit of claim 8, wherein the energy harvesting and scavenging circuitry further comprises an AC/DC converter having an input coupled to the at least one energy harvesting and scavenging coil to receive a time varying voltage and time varying current from the at least one energy harvesting and scavenging coil.

14. The magnetic energy harvesting and scavenging circuit of claim 13, wherein the first substrate is contained in a first chip and wherein the AC/DC converter includes an output coupled to a load that is either contained in the first chip or external to the first chip.

* * * * *